United States Patent
Tanabe

(10) Patent No.: US 8,318,387 B2
(45) Date of Patent: *Nov. 27, 2012

(54) MASK BLANK SUBSTRATE SET AND MASK BLANK SET

(75) Inventor: Masaru Tanabe, Tokyo (JP)

(73) Assignee: Hoya Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/167,433

(22) Filed: Jun. 23, 2011

(65) Prior Publication Data

US 2011/0256473 A1    Oct. 20, 2011

Related U.S. Application Data

(62) Division of application No. 12/570,190, filed on Sep. 30, 2009, now Pat. No. 8,007,961.

(30) Foreign Application Priority Data

Oct. 1, 2008 (JP) ................................. 2008-256800

(51) Int. Cl.
*G03F 1/20* (2012.01)
*G03C 5/00* (2006.01)

(52) U.S. Cl. .......................................... 430/5; 430/311

(58) Field of Classification Search ............... 430/5, 311, 430/312, 313, 394; 428/428, 430
See application file for complete search history.

(56) References Cited

U.S. PATENT DOCUMENTS

| 7,344,808 B2 | 3/2008 | Numanami et al. |
| 8,048,593 B2 * | 11/2011 | Tanabe ........................ 430/5 |
| 2006/0068300 A1 | 3/2006 | Tanabe et al. |

FOREIGN PATENT DOCUMENTS

| JP | 2003-050458 A | 2/2003 |
| JP | 2005-043838 A | 2/2005 |
| JP | 2005043830 A | 2/2005 |

OTHER PUBLICATIONS

Korean Office Action corresponding to Korean Patent Application No. 10-2009-0092310, mailed Feb. 28, 2011.
Japanese Office Action corresponding to Japanese Patent Application No. 2008-256800, dated Apr. 17, 2012.

* cited by examiner

*Primary Examiner* — Stephen Rosasco
(74) *Attorney, Agent, or Firm* — Sughrue Mion, PLLC

(57) ABSTRACT

A substrate set is a mask blank substrate set including a plurality of substrates each for use in a mask blank for producing a photomask to be chucked on a mask stage of an exposure apparatus. In each of the substrates in the mask blank substrate set, a main surface, on the side where a thin film for forming a transfer pattern is to be formed, has a convex shape being relatively high at its center and relatively low at its peripheral portion. In each substrate, the flatness in a 142 mm square area, including a central portion, of the main surface is 0.3 μm or less and the difference upon fitting to a reference main surface of a reference substrate is 40 nm or less.

24 Claims, 12 Drawing Sheets

MASK BLANK SUBSTRATE SET AND MASK BLANK SET

This is a Divisional of application Ser. No. 12/570,190 filed Sep. 30, 2009, claiming priority based on Japanese Patent Application No. 2008-256800, filed on Oct. 1, 2008, the contents of all of which are incorporated herein by reference in their entirety.

TECHNICAL FIELD

This invention relates to a mask blank substrate set (a set of mask blank substrates) and a mask blank set (a set of mask blanks) for a photomask set (a set of photomasks) adapted to be used in photolithography processes.

BACKGROUND ART

In a photolithography process of semiconductor manufacturing processes, a photomask is used. Following the miniaturization of semiconductor devices, a demand for miniaturization in this photolithography process has been increasing. Particularly, an increase in NA of an exposure apparatus using ArF exposure light (193 nm) has proceeded for adaptation to the miniaturization and a further increase in NA is proceeding following the introduction of the immersion exposure technique. For adaptation to the demand for the miniaturization and the increase in NA described above, it is required to enhance the flatness of a photomask. That is, in view of the fact that the allowable amount of position offset of a transfer pattern due to the flatness has been reduced following the reduction in pattern line width and that the focus latitude in the photolithography process has been reduced following the increase in NA, the flatness of a main surface of a mask substrate, particularly the main surface on the side where a pattern is to be formed (hereinafter, the main surface on this side will be referred to simply as a "main surface" or a "substrate main surface"), is becoming more important.

On the other hand, when the photomask is chucked on a mask stage of an exposure apparatus by a vacuum chuck, it may happen that the photomask is largely deformed upon chucking due to the affinity with the mask stage or the vacuum chuck. That is, since the product management is conducted in terms of the flatness of the photomask before chucking, it may happen that even if the photomask is excellent before chucking, when the photomask is chucked on the mask stage of the exposure apparatus, the flatness thereof is largely degraded depending on the affinity with the mask stage or the vacuum chuck. This tendency is outstanding particularly in the case of a substrate that tends to be distorted due to relatively low symmetry of the shape of its main surface. Thus, it is becoming necessary to consider the flatness of the photomask when it is chucked by the vacuum chuck. There has been proposed a method of selecting a mask substrate having excellent flatness after chucking on a mask stage of an exposure apparatus. Such a method is described in, for example, JP-A-2003-50458.

DISCLOSURE OF THE INVENTION

In semiconductor manufacturing processes, when forming a laminated structure having a circuit pattern of a semiconductor device, a photolithography process is carried out for each of layers. In the circuit pattern, it is necessary to form wiring also between upper and lower layers. Therefore, the overlay accuracy of patterns of the respective layers is important. Particularly, following the pattern miniaturization and the increase in pattern density in recent years, high overlay accuracy is required for a set of photomasks that are used in forming a laminated structure of a semiconductor device.

With respect to such a set of photomasks, even if a pattern can be formed with high position accuracy in each photomask, when the main surface shapes of substrates in the respective photomasks differ from each other, deformation tendencies of the substrates when the photomasks are vacuum-chucked in an exposure apparatus in turn differ from each other. Since this also causes different tendencies in position offset of patterns on the substrates, the overlay accuracy of the photomasks is degraded. Therefore, with respect to a substrate set for use in a photomask set that are used in forming a laminated structure having a circuit pattern of a semiconductor device, it is desirable that the shapes of main surfaces, on the side where a pattern is to be formed, of the substrates be close to each other.

On the other hand, in recent years, the pattern miniaturization and the increase in pattern density have advanced significantly so that the formation of a fine high-density pattern in a single mask has been subjected to a limit. As means for solving this lithography technique problem, the double patterning (DP) technique and the double exposure (DE) technique have been developed. The DP technique and the DE technique are common in dividing a single fine high-density pattern into two relatively coarse patterns (a first pattern and a second pattern) and producing photomasks (a first photomask and a second photomask) formed with the two patterns, respectively. On the other hand, these techniques differ in the following points:

In the case of the DP technique, first, an exposure process for transferring a first pattern onto a first resist film coated on an outermost layer of a semiconductor device is carried out using a first photomask and then a development process is carried out, thereby transferring the first pattern onto the first resist film (formation of a first resist pattern). Then, the outermost layer is dry-etched using the first resist pattern as an etching mask, thereby transferring the first pattern onto the outermost layer. Then, the first resist pattern is stripped and a second resist film is coated on the outermost layer. Then, an exposure process for transferring a second pattern onto the second resist film is carried out using a second photomask and then a development process is carried out, thereby transferring the second pattern onto the second resist film (formation of a second resist pattern). Then, the outermost layer is dry-etched using the second resist pattern as an etching mask, thereby transferring the second pattern onto the outermost layer. By carrying out these processes, a fine high-density pattern in combination of the first pattern and the second pattern can be transferred onto the outermost layer of the semiconductor device.

On the other hand, in the case of the DE technique, with respect to a resist film coated on an outermost layer of a semiconductor device, an exposure process for transferring a first pattern is carried out using a first photomask and then an exposure process for transferring a second pattern is carried out using a second photomask. That is, the exposure is carried out twice with respect to the same resist film. Then, by applying a development process to the resist film after these processes, a fine high-density pattern in combination of the first pattern and the second pattern can be transferred onto the resist film. Then, the fine high-density pattern is transferred onto the outermost layer of the semiconductor device according to the usual process.

In either of the DP technique and the DE technique, the overlay accuracy of the first pattern and the second pattern transferred using the set of the two photomasks largely affects the semiconductor device pattern transfer accuracy (if the overlay accuracy is low, serious problems occur for the semiconductor device such as a large change in width of a conductor formed in the semiconductor device and occurrence of a disconnection or short.). Even if a pattern can be formed with very high position accuracy in each photomask, when the main surface shapes of substrates in the set of the two photomasks differ from each other, deformation tendencies of the substrates when the photomasks are vacuum-chucked in an exposure apparatus in turn differ from each other. Since this also causes different tendencies in position offset of patterns on the substrates, the overlay accuracy of the two photomasks is degraded. Therefore, with respect to a substrate set for use in a set of two photomasks that are used in the DP or DE technique, it is desirable that the shapes of main surfaces, on the side where a pattern is to be formed, of the substrates be close to each other.

This invention has been made under these circumstances and has an object to provide a substrate set suitable for photomasks for which high overlay accuracy is required.

A mask blank substrate set of this invention includes a plurality of substrates each for use in a mask blank for producing a photomask to be chucked on a mask stage of an exposure apparatus and is characterized by the following. In each of the substrates in the mask blank substrate set, a main surface, on a side where a thin film for forming a transfer pattern is to be formed, has a convex shape being relatively high at its center and relatively low at its peripheral portion and has a flatness of 0.3 µm or less in a 142 mm square area, including a central portion, of the main surface. A difference upon performing fitting in a 132 mm square area, including the central portion, of the main surface with respect to a reference main surface of a reference substrate is 40 nm or less.

According to this configuration, since the shapes of the substrates included in the substrate set are close to each other, these substrates are suitable for photomasks for which high overlay accuracy is required. Therefore, by the use of photomasks obtained using these substrates, it is possible to perform patterning with high overlay accuracy.

In the mask blank substrate set of this invention, it is preferable that the reference substrate is a virtual substrate having a reference main surface with a shape obtained by averaging the shapes of the main surfaces, on the side where the thin film is to be formed, of the substrates in the mask blank substrate set.

In the mask blank substrate set of this invention, it is preferable that the reference substrate is a specific actual substrate.

In the mask blank substrate set of this invention, it is preferable that reference substrate is a virtual substrate having a reference main surface with a spherical shape in a 132 mm square area including its central portion.

A mask blank set of this invention is preferably such that mask blanks manufactured by using the above-mentioned mask blank substrate set and forming a light-shielding film, for forming a transfer pattern, on the main surface of each of the substrates in the mask blank substrate set are used as a set.

A mask blank substrate set of this invention is a set including a plurality of substrates each for use in a mask blank for producing a photomask to be chucked on a mask stage of an exposure apparatus. In each of the substrates in the mask blank substrate set, a main surface, on a side where a thin film for forming a transfer pattern is to be formed, has a convex shape being relatively high at its center and relatively low at its peripheral portion and has a flatness of 0.3 µm or less in a 142 mm square area, including a central portion, of the main surface. A difference upon performing fitting in a 132 mm square area, including the central portion, of the main surface with respect to a reference main surface of a reference substrate is 40 nm or less.

With this configuration, when a set of a plurality of photomasks for use in photolithography processes of respective layers in forming a circuit pattern of a laminated structure of a semiconductor device are produced using the substrate set of this invention or when a set of two or more photomasks for use in the DP or DE technique are produced using the substrate set of this invention, since the deformation of the substrates that occurs in the respective photomasks when chucked in an exposure apparatus in turn shows substantially the same tendency and the position offset of patterns on the substrates also shows substantially the same tendency, there is an effect of significantly improving the overlay accuracy of transfer patterns of the photomasks.

DETAILED DESCRIPTION OF THE INVENTION

With respect to a mask blank substrate set of this invention, rather than attaching importance to causing main surfaces of mask blank substrates of the mask blank substrate set to have very high flatness when photomasks of a photomask set produced from the mask blank substrate set are not chucked on a mask stage of an exposure apparatus, importance is attached to causing the mask blank substrates to show the same tendency of deformation when the photomasks are chucked on the mask stage in turn, thereby obtaining high overlay accuracy of transfer patterns of the photomasks.

As a result of analyzing a change in shape of a substrate when a photomask is chucked on a mask stage of an exposure apparatus, the following have been found. Normally, when chucking a photomask on a mask stage of an exposure apparatus, areas of a main surface on two opposite end face sides of the photomask are used as chuck areas.

Figure 1:
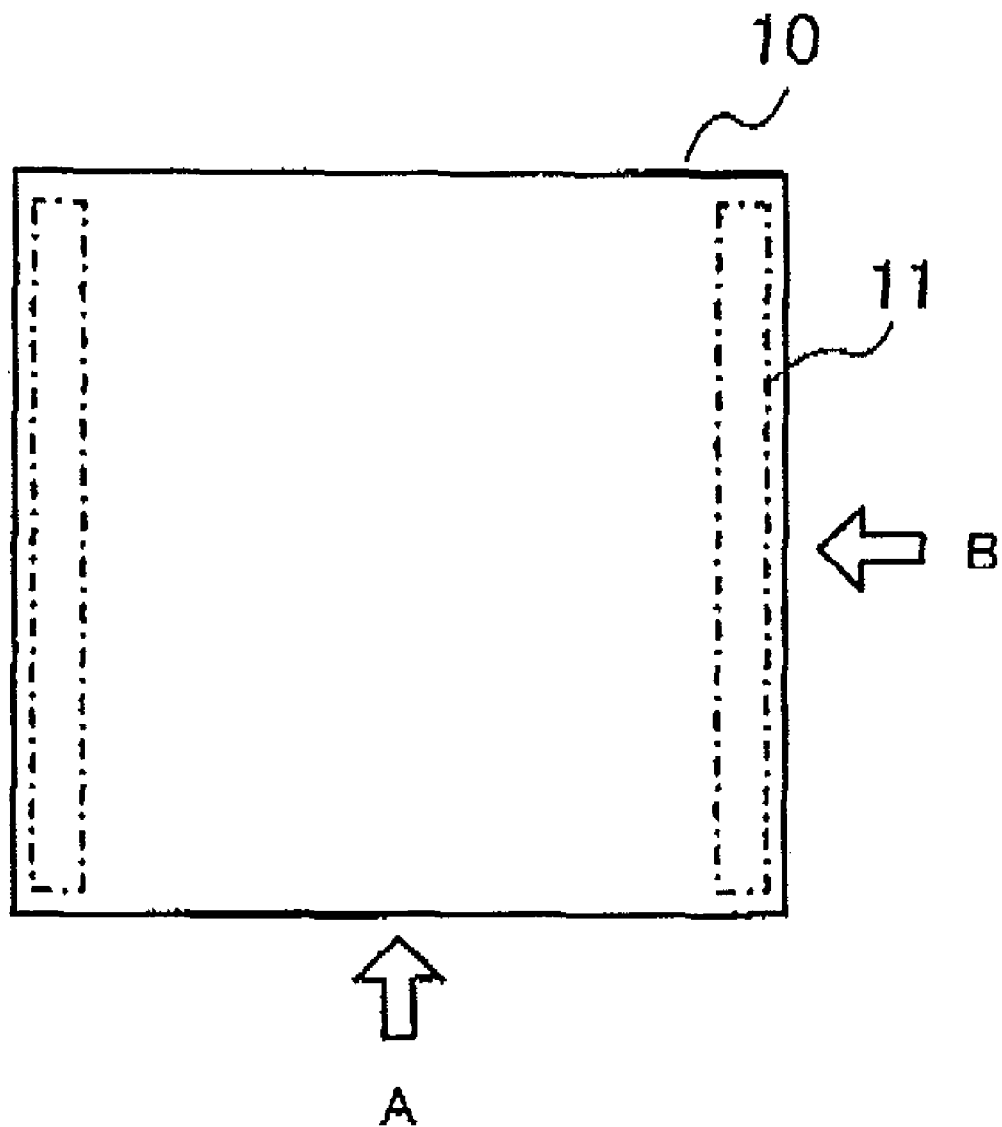
FIG. 1 is a plan view, as seen in a direction of a substrate main surface, when a photomask is placed on chuck stages of an exposure apparatus.
Figures 2A, 2B:
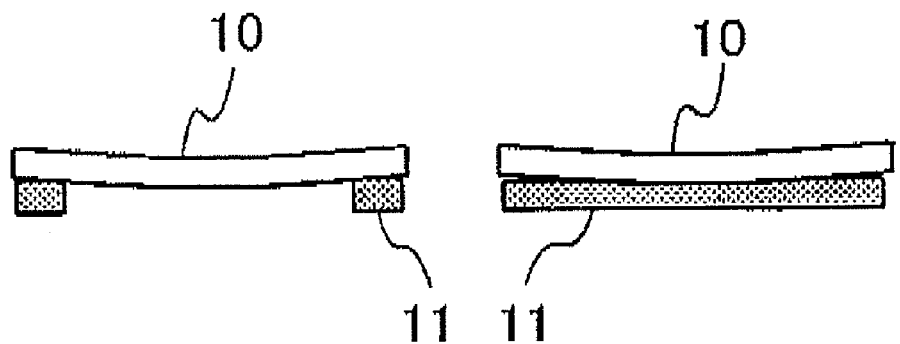
FIG. 2A is a diagram showing the shape of the photomask before chucking it on the chuck stages and is a side view as seen in a direction A indicated in FIG. 1.
FIG. 2B is a diagram showing the shape of the photomask before chucking it on the chuck stages and is a side view as seen in a direction B indicated in FIG. 1.

Generally, a substrate with a main surface polished by a polishing machine tends to have, on the nature of the polishing, a sectional shape in which, basically, the center is high and the end face sides are low, and thus a photomask fabricated from the substrate having such a main surface shape also has the same surface shape. FIG. 1 is a plan view when a photomask 10 having such a shape is placed on chuck stages (portions, with which a surface of a photomask is brought into direct contact so as to be chucked, of a mask stage) 11 of an exposure apparatus. FIG. 2A is a side view, as seen in a direction A (chuck stage short-side direction) indicated in FIG. 1, showing a state before the photomask 10 is chucked on the chuck stages 11. FIG. 2B is a side view, as seen in a direction B (chuck stage long-side direction) indicated in FIG. 1, also showing the state before the photomask 10 is chucked on the chuck stages 11. As seen from FIG. 2A, both end face sides of the photomask 10 are warped up on the chuck stage short-side sides due to the surface shape of the photomask 10. As seen from FIG. 2B, both end face sides of the photomask 10 are warped up on the chuck stage long-side sides due to the surface shape of the photomask 10.

Figures 3A, 3B:
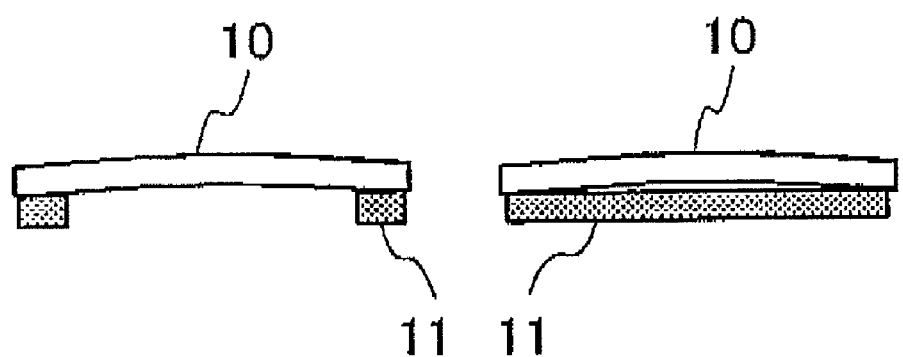
FIG. 3A is a diagram showing the shape of the photomask after chucking it on the chuck stages and is a side view as seen in the direction A indicated in FIG. 1.
FIG. 3B is a diagram showing the shape of the photomask after chucking it on the chuck stages and is a side view as seen in the direction B indicated in FIG. 1.

In such a placed state, when the photomask 10 is chucked on the chuck stages 11, the warped-up four end face sides of the photomask 10 are pulled by suction as shown in FIGS. 3A and 3B. As a result, the photomask 10 receives a force to deform its central portion upward from the four end face directions. That is, a force adapted to deform a main surface of a substrate of the photomask 10 into a quadratic surface (spherical shape) so as to be convex upward toward the center from chuck areas on the four end face sides tends to be applied to the substrate.

Figure 4A:
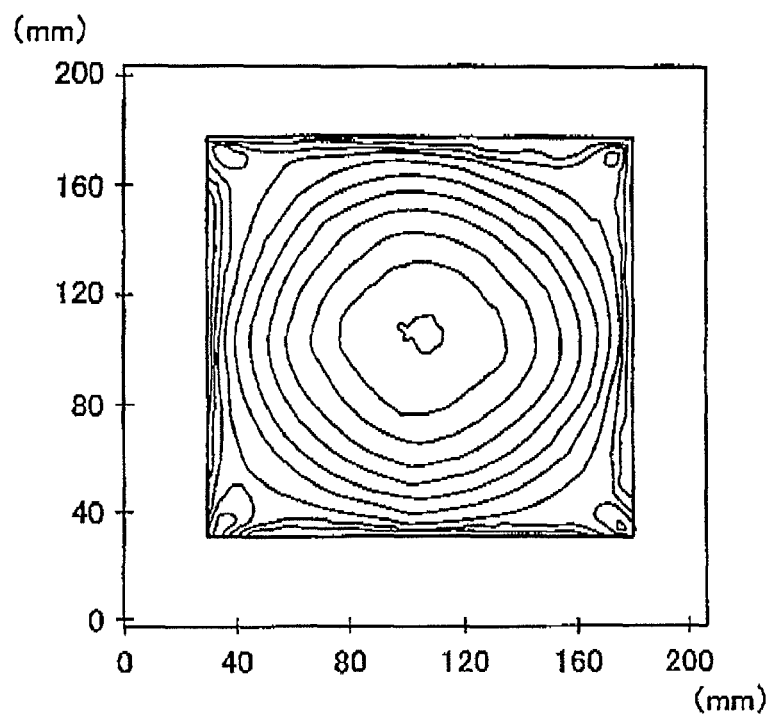
FIG. 4A is a contour diagram showing the shape of a main surface of a substrate to which this invention is applied, wherein the shape of the main surface of the substrate before chucking on chuck stages of an exposure apparatus is illustrated.
Figure 4B:
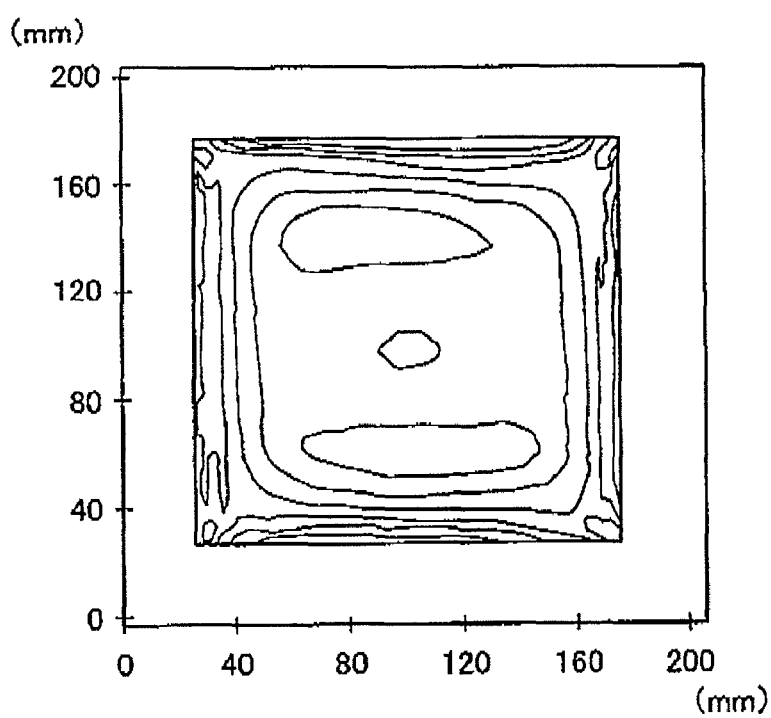
FIG. 4B is a contour diagram showing the shape of the main surface of the substrate to which this invention is applied, wherein the shape of the main surface of the substrate after chucking on the chuck stages of the exposure apparatus is illustrated.

FIGS. 4A and 4B are diagrams respectively showing the shapes of a substrate according to this invention in the states before (before suction) and after (after suction) chucking the substrate on a mask stage of an exposure apparatus. As seen from FIG. 4A, four corners of a main surface of the substrate are a little higher than chuck areas of the main surface and the main surface gradually increases in height toward its center. That is, generally circular contour lines are shown in the substrate before suction. In the substrate after suction, as seen from FIG. 4B, generally rectangular contour lines are shown wherein the number of contour lines in a 132 mm square is small and the intervals thereof are long. That is, the shape of the substrate main surface after chucking is significantly improved in flatness as compared with that before chucking.

Taking this tendency into account, first, a reference substrate is assumed for a mask blank substrate set of this invention such that the shape of its main surface (reference main surface) is a convex shape being relatively high at its center and relatively low at its peripheral portion and is a shape having a flatness of 0.3 µm or less in a 142 mm square area of the reference substrate. Fitting is performed with respect to the reference main surface shape of the reference substrate in a 132 mm square area, including a central portion, of a main surface, on the side where a thin film is to be formed, of a substrate actually manufactured by carrying out predetermined polishing and, if the difference therebetween is 40 nm or less and the flatness in a 142 mm square area, including the central portion, of the main surface of the actually manufactured substrate is 0.3 µm or less, the actually manufactured substrate is judged to be a passed mask blank substrate. Then, a plurality of such passed mask blank substrates are prepared as a mask blank substrate set. Each of photomasks produced using such a mask blank substrate set has high flatness even when it is chucked in the exposure apparatus, and thus the overlay accuracy of transfer patterns of the photomasks can be made high.

The reference substrate may alternatively be a virtual substrate such that the shape of its reference main surface is obtained by averaging the shapes of main surfaces, on the side where a thin film is to be formed, of substrates to be used in a mask blank substrate set. Since, in each of the substrates to be used in the mask blank substrate set, the shape of the main surface on the side where a thin film is to be formed satisfies the condition that the flatness in a 142 mm square area including a central portion thereof is 0.3 µm or less, and thus already has certain high flatness, the shape obtained by averaging the shapes of the main surfaces of these substrates has high flatness.

The reference substrate may alternatively be a specific actual substrate. As described above, in each of the substrates to be used in the mask blank substrate set, the shape of the main surface on the side where a thin film is to be formed satisfies the condition that the flatness in a 142 mm square area including a central portion thereof is 0.3 µm or less, and thus already has certain high flatness. Accordingly, one of these substrates may be used as the specific actual substrate, i.e. the reference substrate. Then, using the shape of the main surface, on the side where a thin film is to be formed, of the specific actual substrate as the reference main surface shape, fitting is performed in a 132 mm square area, including the central portion, of the main surface of each of the substrates. By collecting, as a mask blank substrate set, those substrates each having the main surface shape with a difference of 40 nm or less with respect to the reference main surface shape, each of photomasks produced using such a mask blank substrate set has high flatness when it is chucked in the exposure apparatus, and thus the overlay accuracy of transfer patterns of the photomasks can be made high.

The reference substrate may alternatively be a virtual substrate such that its reference main surface has a spherical shape and a flatness of 0.3 µm or less in a 132 mm square area including a central portion thereof. As a result of simulating the shape of the reference main surface after chucking a photomask using such a reference substrate in the exposure apparatus, the flatness of the reference main surface is 0.08 µm or less. Fitting is performed with respect to this reference main surface shape in a 132 mm square area, including a central portion, of a main surface of each of substrates and those substrates each having a difference of 40 nm or less are collected as a mask blank substrate set. Then, photomasks produced using such a mask blank substrate set can achieve a high overlay accuracy of transfer patterns of the photomasks when the photomasks are chucked in the exposure apparatus in turn and, further, can surely satisfy the flatness required for a photomask of the DRAM half-pitch (hp) 32 nm generation in a 132 mm square area being an area where a transfer pattern is formed.

When fitting the reference main surface to the 132 mm square area in the main surface of the actually manufactured substrate (actual substrate) after polishing, it is preferable to perform the fitting in a height relationship in which the reference main surface is at least higher than the main surface of the actual substrate at the boundary of the 132 mm square area. It is more preferable to perform the fitting in a height relationship in which the reference main surface coincides in height as much as possible with the main surface of the actual substrate at the boundary of the 132 mm square area.

The spherical shape of the reference main surface referred to herein is not limited to a partial shape of a complete spherical surface. Depending on a tendency of the sectional shape of an actual substrate after polishing due to characteristics of a polishing machine used in a polishing process and a suction force of a chuck at a mask stage of an exposure apparatus in which the actual substrate is used, there is a case where a tendency increases that a strong deformation force is applied more to a certain pair of end face sides of the substrate than to the other pair of end face sides perpendicular to the certain pair of end face sides. In such a case, the shape of the reference main surface may be an elliptical spherical shape.

Hereinbelow, an embodiment of this invention will be described in detail with reference to the accompanying drawings.

Figure 5A:
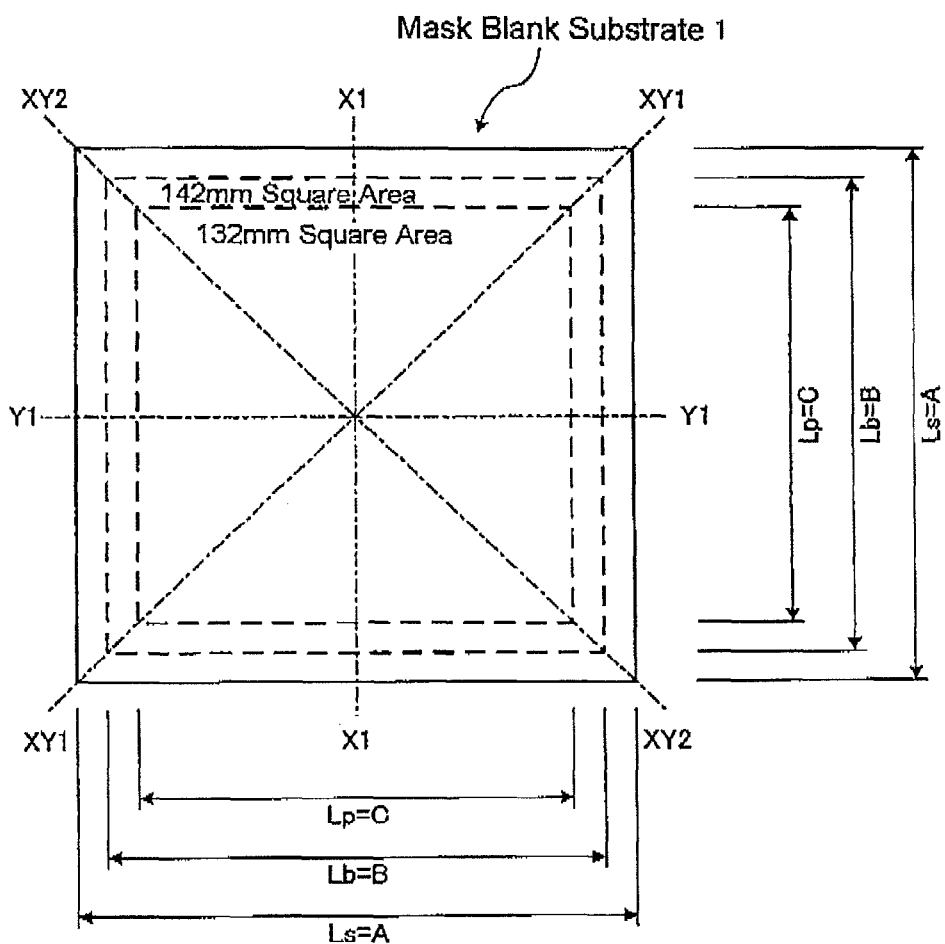
FIG. 5A is a plan view, as seen in a direction of a main surface, of a mask blank substrate according to an embodiment of this invention.
Figure 5B:
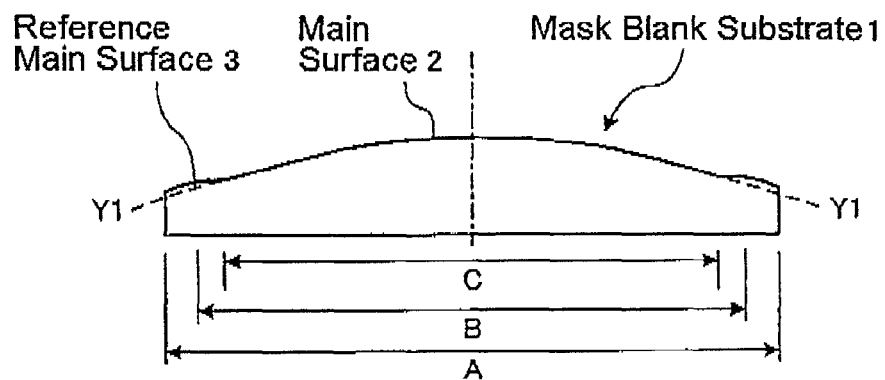
FIG. 5B is a sectional view taken along line Y1-Y1 in FIG. 5A.
Figure 5C:
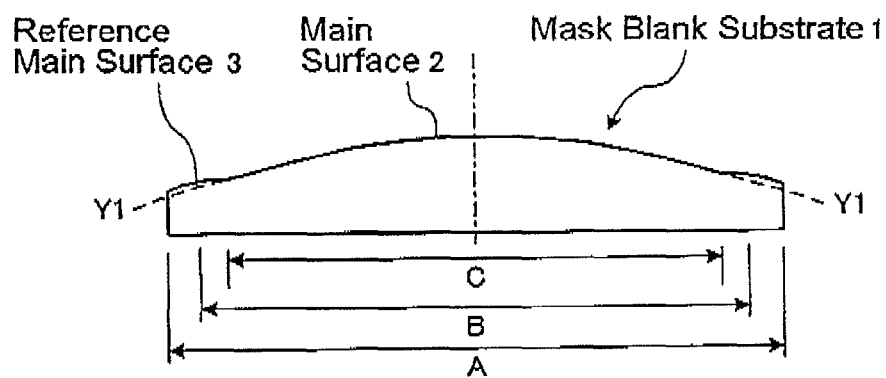
FIG. 5C is a sectional view taken along line XY1-XY1 in FIG. 5A.

FIG. 5A is a plan view for explaining a mask blank substrate 1 for use in a mask blank substrate set according to the embodiment of this invention, FIG. 5B is a sectional view taken along line Y1-Y1 in FIG. 5A, and FIG. 5C is a sectional view taken along line XY1-XY1 in FIG. 5A. The shape shown in FIG. 5B is substantially the same as the shape in a sectional view taken along line X1-X1 in FIG. 5A and the shape shown in FIG. 5C is substantially the same as the shape in a sectional view taken along line XY2-XY2 in FIG. 5A. In the mask blank substrate 1 shown in FIG. 5A, a main surface 2 on the side where a thin film for forming a transfer pattern is to be formed has a flatness of 0.3 μm or less in a 142 mm square area including its central portion and has a convex shape being relatively high at its center and relatively low at its peripheral portion. In FIG. 5A, it is given that the length of one side of the mask blank substrate 1 is Ls (A=152 mm), the length of one side of a 142 mm square area is Lb (B=142 mm), and the length of one side of a 132 mm square area is Lp (C=132 mm). The flatness in the 142 mm square area represents a difference (height difference) H between the highest portion and the lowest portion of the mask blank substrate 1 in that area as shown in FIGS. 5B and 5C.

In the mask blank substrate 1, the difference upon fitting a reference main surface 3 of a predetermined reference substrate to the shape of the main surface 2 is 40 nm or less. As the reference substrate, use can be made of any one of the reference substrates satisfying various conditions as described before, but, herein, use is made of the reference substrate in which the shape of the reference main surface 3 is a convex shape being relatively high at its center and relatively low at its peripheral portion and is a spherical shape in a 132 mm square area of the reference main surface 3. More specifically, the reference substrate is such that the reference main surface 3 has a flatness of 0.3 μm or less, preferably 0.2 μm or less in the 132 mm square area including its central portion. Particularly when the reference substrate is intended for obtaining a mask blank substrate that can be commonly used for various chuck-type exposure apparatuses, it is preferable that the reference main surface 3 have a shape defined by a true spherical surface.

Figure 6:
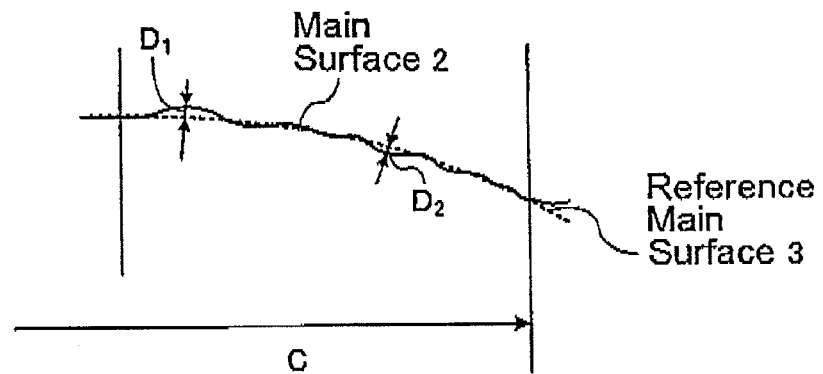
FIG. 6 is a diagram showing a partial enlarged section of the mask blank substrate shown in FIG. 5B.

FIG. 6 is a partial enlarged sectional view of the mask blank substrate 1 shown in FIG. 5B. The (virtual) reference main surface 3 is the main surface of the reference substrate and FIG. 6 shows a state where the reference main surface 3 is fitted to the main surface 2. In FIG. 6, $D_1$ and $D_2$ represent differences upon performing fitting to the reference main surface 3 in the 132 mm square area (area indicated by Lp in FIG. 5A), including the central portion, of the main surface 2. $D_1$ represents a maximum difference (absolute value) among differences at portions where the main surface 2 is located above the reference main surface 3, while, $D_2$ represents a maximum difference (absolute value) among differences at portions where the main surface 2 is located below the reference main surface 3. Of these differences $D_1$ and $D_2$, the larger difference is 40 nm or less.

That is, a combination of a plurality of substrates each having a difference of 40 nm or less upon performing fitting in a 132 mm square area of its main surface, on the side where a thin film for forming a transfer pattern is to be formed, with respect to a reference main surface of a specific reference substrate is called a substrate set of this invention. Since the mask blank substrates included in such a substrate set are close to each other in shape, a photomask set obtained using such a substrate set is suitable as a photomask set for which high overlay accuracy is required. Therefore, by the use of the photomask set obtained using such substrates, it is possible to carry out patterning with high overlay accuracy.

The shape of the main surface 2 of the mask blank substrate 1 was measured by a wavelength-shift interferometer using a wavelength modulation laser. This wavelength-shift interferometer calculates differences in height of a measuring surface of a mask blank substrate from interference fringes generated by the interference between reflected light reflected from the measuring surface and a back surface of the mask blank substrate and reference light from a measuring apparatus reference surface (front reference surface), detects differences in frequency of the interference fringes, and separates the interference fringes, thereby measuring the shape of irregularities of the measuring surface.

In this invention, a glass substrate can be used as a mask blank substrate. The glass substrate is not particularly limited as long as it can be used for a mask blank. For example, as a material of the glass substrate, use can be made of a synthetic quartz glass, a soda-lime glass, an aluminosilicate glass, a borosilicate glass, an alkali-free glass, or the like. In the case of a glass substrate of an EUV mask blank, in order to suppress the distortion of a transfer pattern due to heat in exposure, use is made of a glass material having a low thermal expansion coefficient in a range of about $0 \pm 1.0 \times 10^{-7}/°$ C., preferably in a range of about $0 \pm 0.3 \times 10^{-7}/°$ C. Further, since the EUV mask blank is formed with many films on the glass substrate, use is made of a high-rigidity glass material that can suppress deformation due to film stress. Particularly, a glass material having a high Young's modulus of 65 GPa or more is preferable. For example, use is made of an amorphous glass such as a $SiO_2$-$TiO_2$-based glass or a synthetic quartz glass or a crystallized glass in which a β-quartz solid solution is precipitated.

Such a mask blank substrate can be manufactured through, for example, a rough polishing process, a precision polishing process, and an ultra-precision polishing process.

A substrate to be manufactured is polished aiming, at minimum, at that the shape of its main surface on the side where a thin film for forming a transfer pattern is to be formed becomes a convex shape being relatively high at its center and relatively low at its peripheral portion and the flatness becomes 0.3 μm or less in a 142 mm square area, including a central portion, of the main surface. Further, when the shape of a reference main surface of a reference substrate is set in advance, the substrate is polished so as to be fitted to the shape of the reference main surface in a 132 mm square area including a central portion thereof.

Particularly, when the shape of the reference main surface of the reference substrate is a spherical shape, the shape of the main surface of the substrate to be manufactured is adjusted in the respective polishing processes so as to approximate a curved surface defined by $x^2+y^2+z^2=r^2$ (r: radius of curvature). The curved surface shape of the reference main surface having a flatness of 0.3 μm or less in the 132 mm square area is such that its radius of curvature r is about 14,500,000 mm or more, and the curved surface shape of the reference main surface having a flatness of 0.2 μm or less in the 132 mm square area is such that its radius of curvature r is about 21,720,000 mm or more.

By forming at least a light-shielding film on the main surface, having the above-mentioned convex shape, of the mask blank substrate described above, a mask blank can be obtained. As a material of this light-shielding film, chromium or molybdenum silicide can be used. In the case of a chromium-based light-shielding film, nitrogen, oxygen, and/or carbon may be added to Cr. In the case of a molybdenum silicide-based light-shielding film, nitrogen, oxygen, and/or carbon may be added to MoSi.

Depending on the use and structure of a photomask, another film such as an antireflection film or a semi-transmissive film may be appropriately formed. As a material of the antireflection film, it is preferable to use MoSiON, MoSiO, MoSiN, MoSiOC, MoSiOCN, or the like. As a material of the semi-transmissive film, it is preferable to use CrO, CrON, MoSiN, MoSiON, or the like.

Further, an etching mask film having etching resistance to the light-shielding film or the antireflection film may be formed on such a film and an etching stopper film may be formed between the substrate and the light-shielding film.

The light-shielding film can be formed by sputtering. As a sputtering apparatus, it is possible to use a DC magnetron sputtering apparatus, an RF magnetron sputtering apparatus, or the like. When sputtering the light-shielding film on the mask blank substrate, it is preferable to rotate the substrate and to dispose a sputtering target at a position inclined by a predetermined angle with respect to a rotational axis of the substrate, thereby forming the light-shielding film. By such a film forming method, it is possible to minimize in-plane variation of the light-shielding film and thus to uniformly form the light-shielding film.

Figure 7:
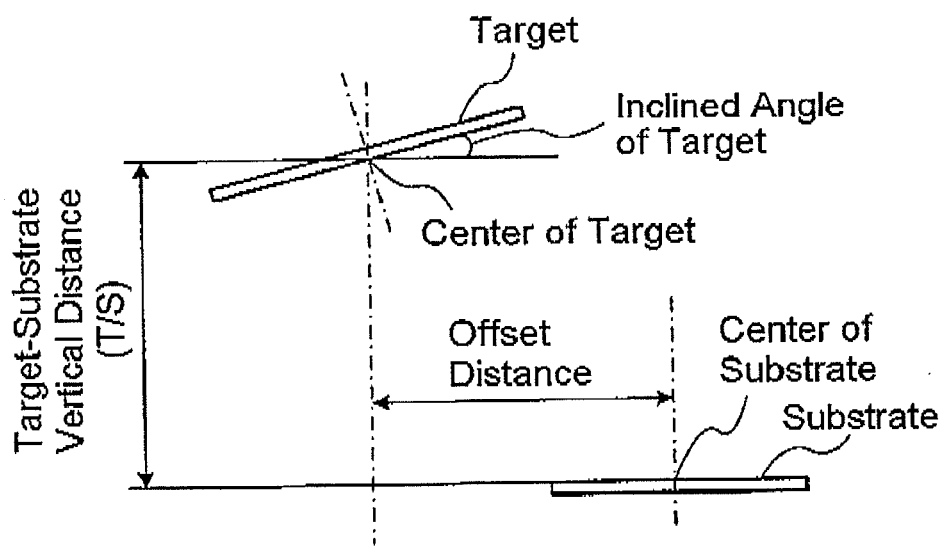
FIG. 7 is a diagram showing a schematic structure of a sputtering apparatus for use in manufacturing a mask blank according to the embodiment of this invention.

In the case of carrying out the film formation by rotating the substrate and disposing the sputtering target at the position inclined by the predetermined angle with respect to the rotational axis of the substrate, the in-plane distributions of the phase angle and the transmittance also change by the positional relationship between the substrate and the target. The positional relationship between the substrate and the target will be explained with reference to FIG. 7. The offset distance (distance between the central axis of the substrate and a straight line passing through the center of the target and parallel to the central axis of the substrate) is adjusted by an area in which the phase angle and transmittance distributions are to be ensured. Generally, when such an area is large, the required offset distance becomes long. In this embodiment, in order to realize a phase angle distribution ±2° or less and a transmittance distribution ±0.2°% or less in the substrate in the 142 mm square area, the offset distance is required to be about 200 mm to about 350 mm and is preferably 240 mm to 280 mm. The optimal range of the target-substrate vertical distance (T/S) changes depending on the offset distance, but in order to realize a phase angle distribution ±2° or less and a transmittance distribution ±0.2°% or less in the substrate in the 142 mm square area, the target-substrate vertical distance (T/S) is required to be about 200 mm to about 380 mm and is preferably 210 mm to 300 mm. The inclination angle of the target affects the film forming rate and, in order to obtain a high film forming rate, it is suitably 0° to 45° and preferably 10° to 30°.

By patterning at least the light-shielding film by photolithography and etching to form a transfer pattern, a photomask can be manufactured. An etchant for etching is properly changed depending on a material of a film to be etched.

Next, a description will be given of Examples carried out for clarifying the effect of this invention. In the following Examples, a substrate set is a mask blank substrate (glass substrate) set.

EXAMPLE 1

With respect to the shape of a mask blank substrate to be manufactured in Example 1, polishing is carried out aiming at that the shape of its main surface on the side where a thin film for forming a transfer pattern is to be formed becomes a shape in which the flatness is 0.3 μm in a 142 mm square area, including a central portion, of the main surface. Specifically, the mask blank substrate is manufactured through the following polishing processes.

A glass substrate obtained by lapping and chamfering a synthetic quartz glass substrate was subjected to a rough polishing process under the following polishing conditions. After the rough polishing process, the glass substrate was ultrasonically cleaned for removing polishing abrasive grains adhering to the glass substrate. The polishing conditions such as the processing pressure, the rotational speeds of upper and lower surface plates, and the polishing time were properly adjusted.

Polishing Liquid: cerium oxide (average grain size 2 μm to 3 μm)+water
Polishing Pad: hard polisher (urethane pad)

Then, the glass substrate after the rough polishing was subjected to a precision polishing process under the following polishing conditions. After the precision polishing process, the glass substrate was ultrasonically cleaned for removing polishing abrasive grains adhering to the glass substrate. The precision polishing is carried out by adjusting various conditions so that the shape of a main surface, on the side where a transfer pattern is to be formed, of the glass substrate after the precision polishing process becomes convex at four corners. This is because the next ultra-precision polishing process has a feature to preferentially polish four corners of the substrate main surface, and thus this makes it possible to prevent edge exclusion at the four corners and to achieve a flatness of 0.3 μm or less in a 142 mm square area of the substrate main surface.

Polishing Liquid: cerium oxide (average grain size 1 μm)+water

Polishing Pad: soft polisher (suede type)

Then, the glass substrate after the precision polishing was subjected to the ultra-precision polishing process under the following polishing conditions. After the ultra-precision polishing process, the glass substrate was ultrasonically cleaned for removing polishing abrasive grains adhering to the glass substrate. The polishing conditions such as the processing pressure, the rotational speeds of upper and lower surface plates, and the polishing time were properly adjusted. In this ultra-precision polishing process, the four corners tend to be preferentially polished due to the substrate shape being square. The polishing conditions are set so that the flatness in the 142 mm square area of the substrate main surface does not exceed 0.3 μm while the surface roughness of the substrate main surface becomes a predetermined roughness of 0.4 nm or less. In this manner, the glass substrate (152.4 mm×152.4 mm×6.35 mm) according to this invention was manufactured.

Polishing Liquid: colloidal silica (average grain size 100 nm)+water

Polishing Pad: super-soft polisher (suede type)

The shape of a plurality of glass substrates each thus obtained was measured by a wavelength-shift interferometer using a wavelength modulation laser. Among the plurality of glass substrates, a selection was made of those glass substrates in which the flatness of the main surface on the side where a thin film for forming a transfer pattern was to be formed was 0.3 μm or less in the 142 mm square area including its central portion. Then, the average main surface shape was calculated with respect to 100 glass substrates among the selected glass substrates and determined as the shape of a reference main surface of a reference substrate. Then, with respect to each of the 100 glass substrates, fitting was performed in a 132 mm square area including its central portion with respect to the determined reference main surface shape and a selection was made of those glass substrates each having a difference of 40 nm or less. Then, 10 glass substrates were further selected from the selected glass substrates as a mask blank substrate set (substrate set).

Then, a back-surface antireflection layer, a light-shielding layer, and a front-surface antireflection layer were formed in this order as a light-shielding film (thin film for forming a transfer pattern) on each of the glass substrates of the above-mentioned substrate set. Specifically, using a Cr target as a sputtering target and using a mixed gas of Ar, $CO_2$, $N_2$, and He (gas flow rate ratio Ar:$CO_2$:$N_2$:He=24:29:12:35) as a sputtering gas, a CrOCN film was formed to a thickness of 39 nm as the back-surface antireflection layer by setting the gas pressure to 0.2 Pa and the power of the DC power supply to 1.7 kW. Then, using a Cr target as a sputtering target and using a mixed gas of Ar, NO, and He (gas flow rate ratio Ar:NO:He=27:18:55) as a sputtering gas, a CrON film was formed to a thickness of 17 nm as the light-shielding layer by setting the gas pressure to 0.1 Pa and the power of the DC power supply to 1.7 kW. Then, using a Cr target as a sputtering target and using a mixed gas of Ar, $CO_2$, $N_2$, and He (gas flow rate ratio Ar:$CO_2$:$N_2$:He=21:37:11:31) as a sputtering gas, a CrOCN film was formed to a thickness of 14 nm as the front-surface antireflection layer by setting the gas pressure to 0.2 Pa and the power of the DC power supply to 1.8 kW. In this manner, 10 mask blanks were produced and subjected to a defect inspection using an inspection apparatus (M1350: manufactured by Lasertec Corporation). Then, 5 mask blanks were selected from the passed mask blanks as a mask blank set.

Then, 2 mask blanks were extracted from the mask blank set thus obtained and, using the DP technique, two transfer patterns in the form of two relatively coarse patterns divided from a single fine high-density transfer pattern corresponding to the DRAM hp32 nm generation were formed in the light-shielding films of the mask blanks through predetermined processes, respectively, thereby obtaining a set of DP photomasks. Each of the DP photomasks was inspected by a mask inspection apparatus and found to satisfy the conditions required for a DP photomask of the DRAM hp32 nm generation. Further, using this DP photomask set, pattern transfer was performed on resist films, in turn, on a transfer target (wafer or the like) by the use of an exposure apparatus. Then, it was verified that there was no wiring short or disconnection in a finally formed fine high-density pattern of the transfer target otherwise caused by lack of pattern overlay accuracy and thus the DP photomask set had high overlay accuracy.

Further, 2 mask blanks were extracted from a mask blank set manufactured in the same manner as described above and, using the DE technique, two transfer patterns in the form of two relatively coarse patterns divided from a single fine high-density transfer pattern corresponding to the DRAM hp32 nm generation were formed in light-shielding films of the mask blanks through predetermined processes, respectively, thereby obtaining a set of DE photomasks. Each of the DE photomasks was inspected by a mask inspection apparatus and found to satisfy the conditions required for a DE photomask of the DRAM hp32 nm generation. Further, using this DE photomask set, pattern transfer was performed on a resist film on a transfer target (wafer or the like) by the use of an exposure apparatus. Then, it was verified that there was no wiring short or disconnection in a finally formed fine high-density pattern of the transfer target otherwise caused by lack of pattern overlay accuracy and thus the DE photomask set had high overlay accuracy.

Further, with respect to a set of mask blanks manufactured in the same manner as described above, patterns for forming a circuit pattern of a laminated structure of a semiconductor device corresponding to the DRAM hp45 nm generation were formed in light-shielding films of the mask blanks through predetermined processes, respectively, thereby obtaining a set of photomasks. Using this photomask set, the patterns were transferred onto resist films, in turn, on a wafer by the use of an exposure apparatus. Then, it was verified that there was no wiring short or disconnection in the finally formed circuit pattern of the wafer between its upper and lower layers otherwise caused by lack of pattern overlay accuracy and thus the photomask set had high overlay accuracy.

EXAMPLE 2

A plurality of glass substrates were obtained by performing a rough polishing process, a precision polishing process, and an ultra-precision polishing process in the same manner as in Example 1. The shape of the plurality of glass substrates thus obtained was measured by a wavelength-shift interferometer using a wavelength modulation laser. Among the plurality of glass substrates, a selection was made of those glass substrates in which the flatness of a main surface on the side where a thin film for forming a transfer pattern was to be formed was 0.3 µm or less in a 142 mm square area including its central portion. Then, with respect to each of the selected glass substrates, fitting was performed in a 132 mm square area including its central portion with respect to the reference main surface shape of a reference substrate (the curved surface shape in the form of a spherical surface having a radius of curvature r=14,508,150 mm and a flatness of 0.3 µm in a 132 mm square area) and a selection was made of those glass substrates each having a difference of 40 nm or less. Then, 10 glass substrates were further selected from the selected glass substrates as a mask blank substrate set (substrate set).

Then, in the same manner as in Example 1, a back-surface antireflection layer, a light-shielding layer, and a front-surface antireflection layer were formed in this order as a light-shielding film (thin film for forming a transfer pattern) on each of the glass substrates of the above-mentioned substrate set. In this manner, 10 mask blanks were produced and subjected to a defect inspection using an inspection apparatus (M1350). Then, 5 mask blanks were selected from the passed mask blanks as a mask blank set.

Then, 2 mask blanks were extracted from the mask blank set thus obtained and a set of DP photomasks corresponding to the DRAM hp32 nm generation were produced in the same manner as in Example 1. Each of the DP photomasks was inspected by a mask inspection apparatus and found to satisfy the conditions required for a DP photomask of the DRAM hp32 nm generation. Further, using this DP photomask set, pattern transfer was performed on resist films, in turn, on a transfer target (wafer or the like) by the use of an exposure apparatus. Then, it was verified that there was no wiring short or disconnection in a finally formed fine high-density pattern of the transfer target otherwise caused by lack of pattern overlay accuracy and thus the DP photomask set had high overlay accuracy.

Further, 2 mask blanks were extracted from a mask blank set manufactured in the same manner as described above and a set of DE photomasks corresponding to the DRAM hp32 nm generation were produced in the same manner as in Example 1. Each of the DE photomasks was inspected by a mask inspection apparatus and found to satisfy the conditions required for a DE photomask of the DRAM hp32 nm generation. Further, using this DE photomask set, pattern transfer was performed on a resist film on a transfer target (wafer or the like) by the use of an exposure apparatus. Then, it was verified that there was no wiring short or disconnection in a finally formed fine high-density pattern of the transfer target otherwise caused by lack of pattern overlay accuracy and thus the DE photomask set had high overlay accuracy.

Further, with respect to a set of mask blanks manufactured in the same manner as described above, patterns for forming a circuit pattern of a laminated structure of a semiconductor device corresponding to the DRAM hp45 nm generation were formed in light-shielding films of the mask blanks through predetermined processes, respectively, thereby obtaining a set of photomasks. Using this photomask set, the patterns were transferred onto resist films, in turn, on a wafer by the use of an exposure apparatus. Then, it was verified that there was no wiring short or disconnection in the finally formed circuit pattern of the wafer between its upper and lower layers otherwise caused by lack of pattern overlay accuracy and thus the photomask set had high overlay accuracy.

EXAMPLE 3

A plurality of glass substrates were obtained by performing a rough polishing process, a precision polishing process, and an ultra-precision polishing process in the same manner as in Example 1. The shape of the plurality of glass substrates thus obtained was measured by a wavelength-shift interferometer using a wavelength modulation laser. Among the plurality of glass substrates, a selection was made of those glass substrates in which the flatness of a main surface on the side where a thin film for forming a transfer pattern was to be formed was 0.3 µm or less in a 142 mm square area including its central portion. Then, with respect to each of the selected glass substrates, fitting was performed in a 132 mm square area including its central portion with respect to the reference main surface shape of a reference substrate (the curved surface shape in the form of a spherical surface having a radius of curvature r=21,762,225 mm and a flatness of 0.2 µm in a 132 mm square area) and a selection was made of those glass substrates each having a difference of 40 nm or less. Then, 10 glass substrates were further selected from the selected glass substrates as a mask blank substrate set (substrate set).

Figure 8:
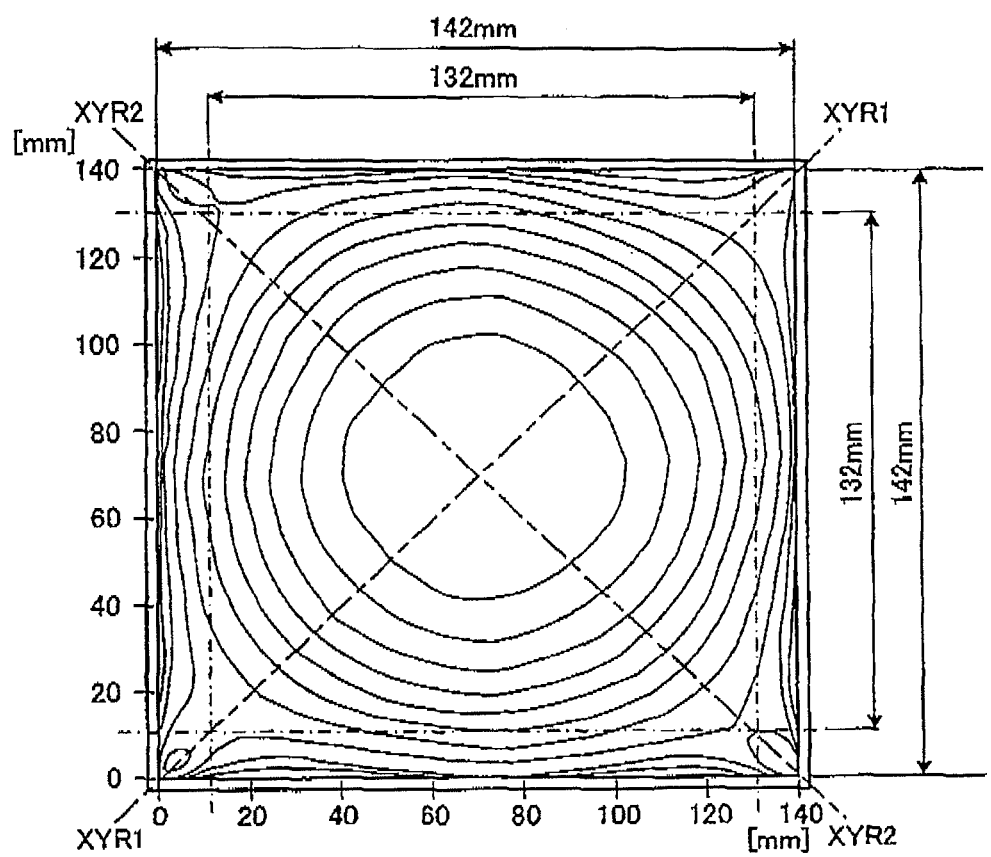
FIG. 8 is a contour diagram showing the shape of a main surface of a glass substrate manufactured in Example 3.
Figure 9:
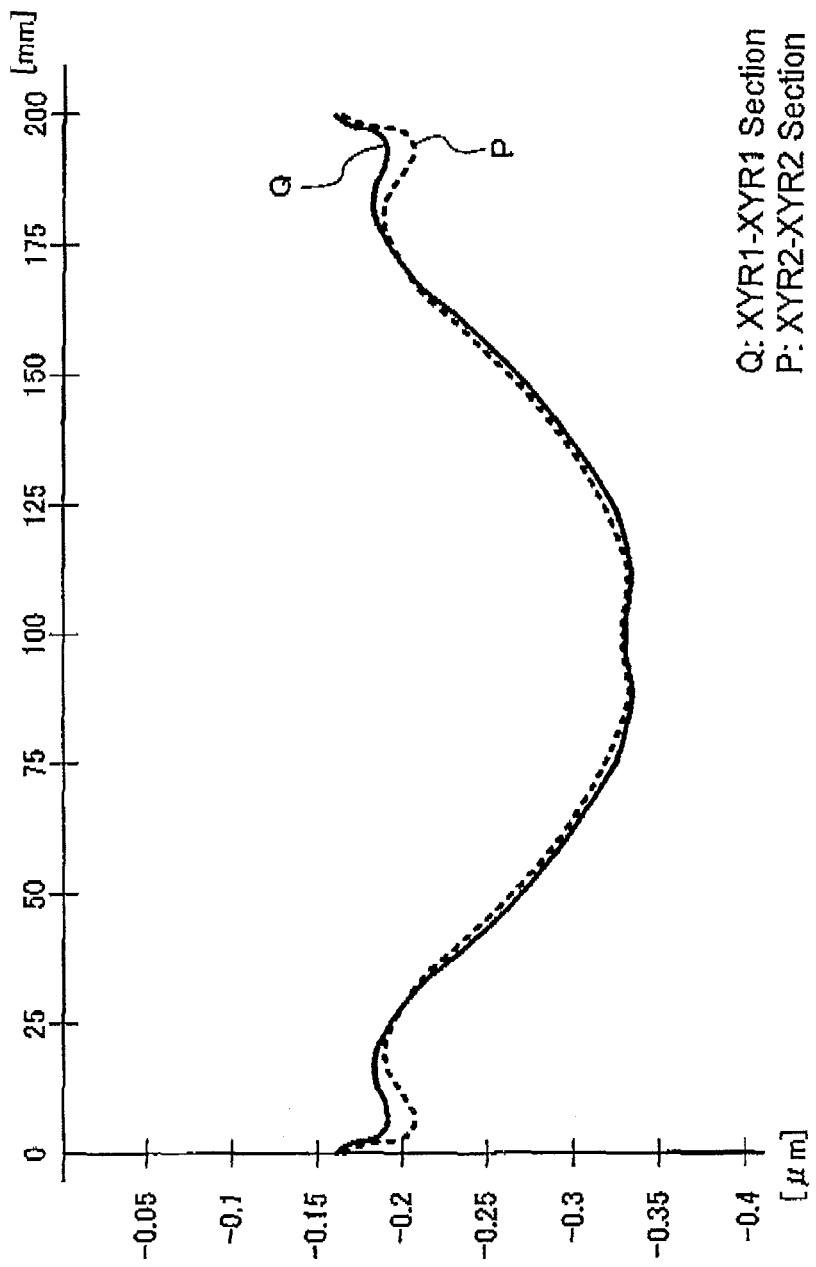
FIG. 9 is a diagram showing the shapes of the main surface in sections along line XYR1-XYR1 and line XYR2-XYR2 of the glass substrate shown in FIG. 8.
Figure 10:
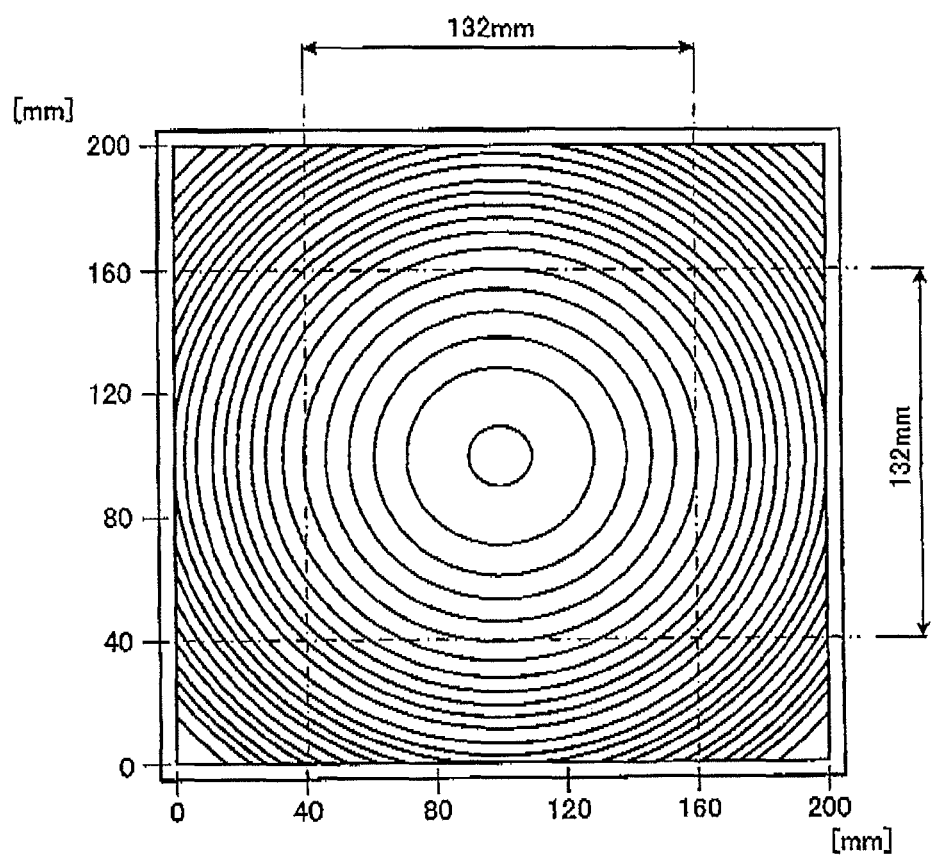
FIG. 10 is a contour diagram showing the shape of a reference main surface.
Figure 11:
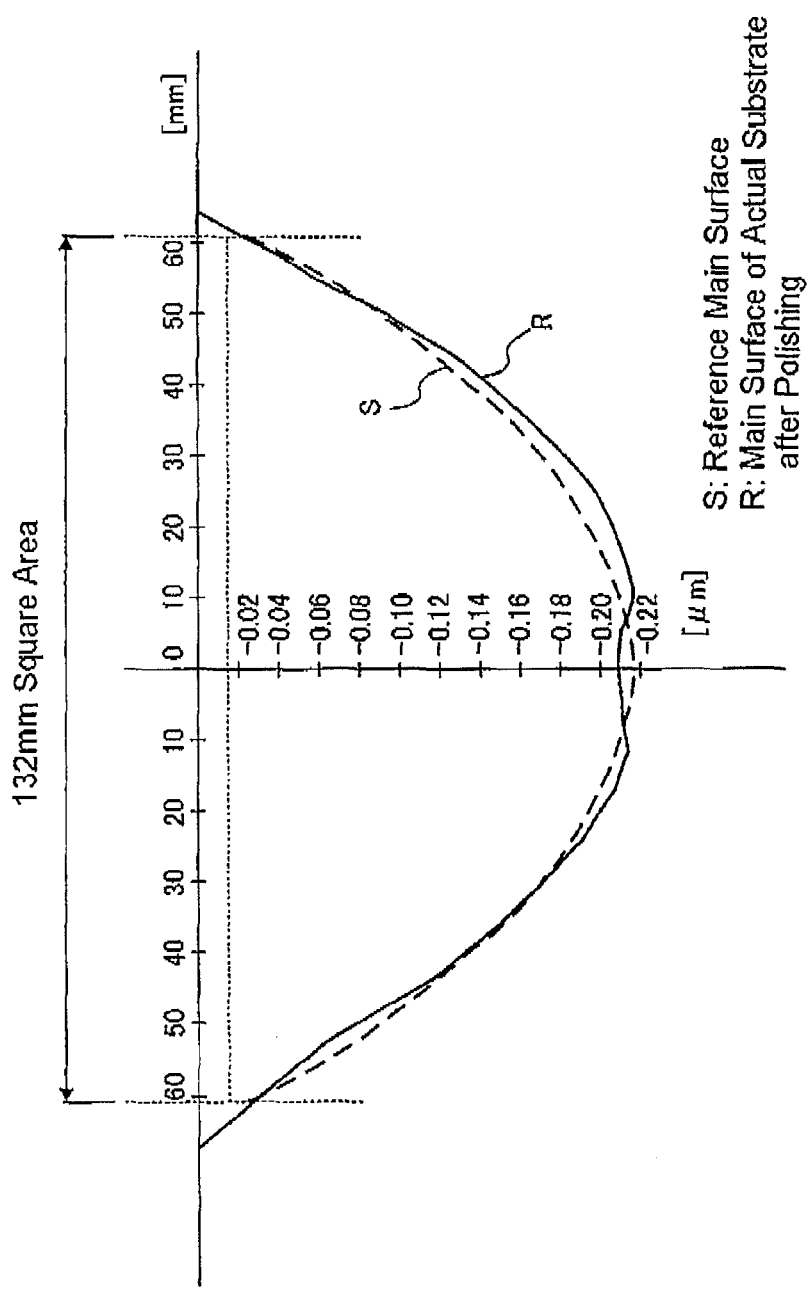
FIG. 11 is a diagram upon fitting the reference main surface shown in FIG. 10 to the glass substrate shown in FIG. 8.
Figure 12:
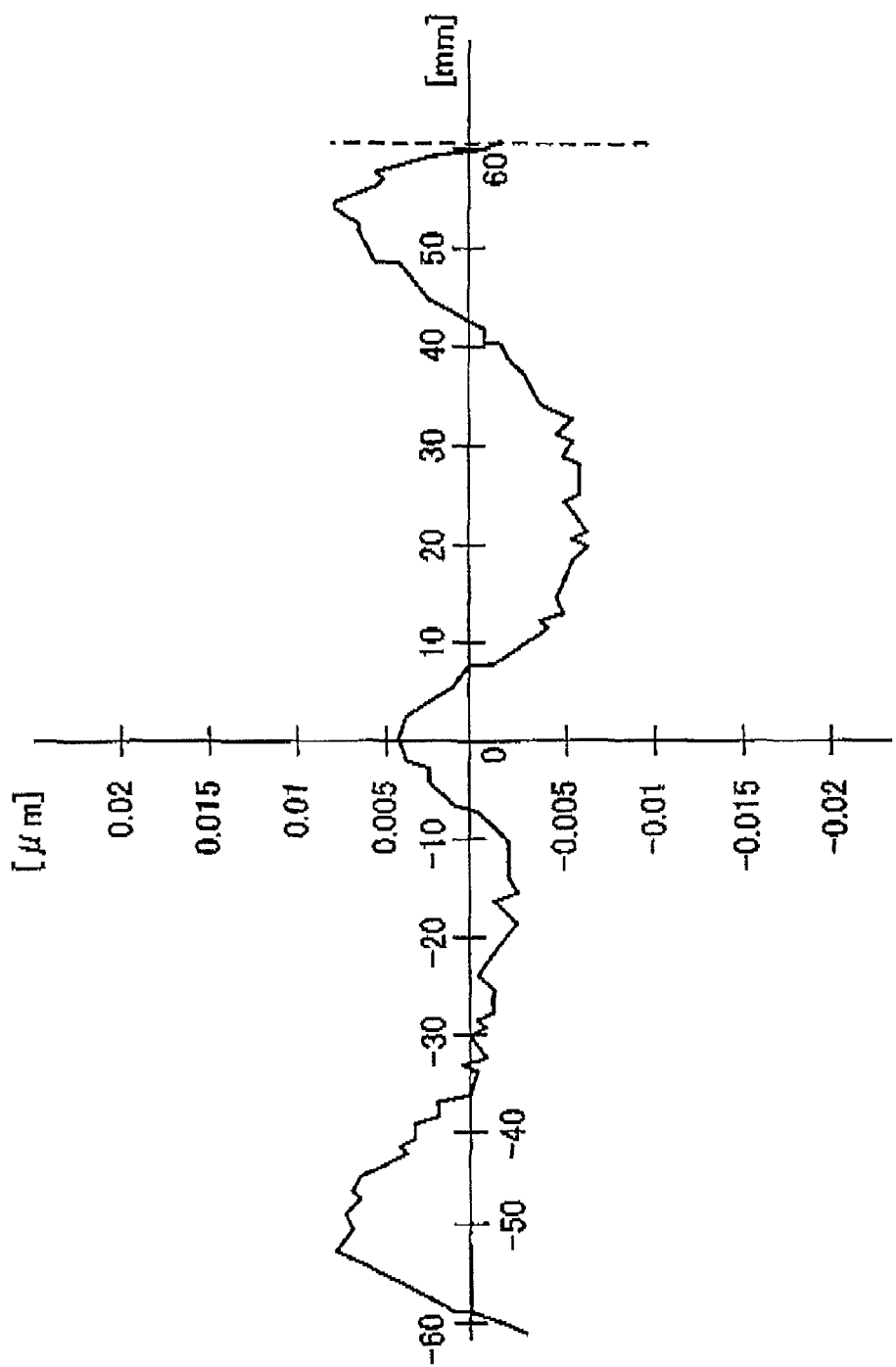
FIG. 12 is a diagram showing fitting differences upon performing the fitting in FIG. 11.

FIG. 8 is a contour diagram showing the shape of the main surface measured by the wavelength-shift interferometer with respect to one of the manufactured glass substrates. FIG. 9 shows the shapes of the main surface in sections along diagonals (line XYR1-XYR1 and line XYR2-XYR2 in FIG. 8) of the glass substrate shown in FIG. 8. As a result of the measurement, the flatness in a 142 mm square area of this glass substrate was 0.19 µm and the flatness in a 132 mm square area thereof was 0.18 µm, thus satisfying the intended flatness of 0.2 µm or less. FIG. 10 is a contour diagram showing the shape of the reference main surface, for carrying out fitting in its 132 mm square area, of the reference substrate. FIG. 11 shows one sectional shape upon fitting the reference main surface of FIG. 10 to the glass substrate of FIG. 8 in the 132 mm square area. FIG. 12 shows differences between the main surface of the glass substrate and the ideal reference main surface shape upon performing the fitting in FIG. 11. With respect to the differences shown in FIG. 12, a portion where the height of the reference main surface is higher than the height of the main surface of the glass substrate upon fitting is represented by a positive value, while, a portion where the height of the main surface of the glass substrate is higher upon fitting is represented by a negative value.

As seen from the results shown in FIG. 12, the fitting difference was 0.0075 µm (7.5 nm) in positive value and −0.0067 µm (6.7 nm) in negative value and thus the results were excellent. Even over the entire 132 mm square area, the fitting difference was 0.011 µm (11 nm) at maximum and thus 40 nm or less and, therefore, it is seen that this glass substrate was a passed product with high accuracy.

Then, in the same manner as in Example 1, a back-surface antireflection layer, a light-shielding layer, and a front-surface antireflection layer were formed in this order as a light-shielding film (thin film for forming a transfer pattern) on each of the glass substrates of the above-mentioned substrate set. In this manner, 10 mask blanks were produced and subjected to a defect inspection using an inspection apparatus (M1350). Then, 5 mask blanks were selected from the passed mask blanks as a mask blank set.

Then, 2 mask blanks were extracted from the mask blank set thus obtained and a set of DP photomasks corresponding to the DRAM hp22 nm generation were produced in the same manner as in Example 1. Each of the DP photomasks was inspected by a mask inspection apparatus and found to satisfy the conditions required for a DP photomask of the DRAM hp22 nm generation. Further, using this DP photomask set, pattern transfer was performed on resist films, in turn, on a transfer target (wafer or the like) by the use of an exposure apparatus. Then, it was verified that there was no wiring short or disconnection in a finally formed fine high-density pattern of the transfer target otherwise caused by lack of pattern overlay accuracy and thus the DP photomask set had high overlay accuracy.

Further, 2 mask blanks were extracted from a mask blank set manufactured in the same manner as described above and a set of DE photomasks corresponding to the DRAM hp22 nm generation were produced in the same manner as in Example 1. Each of the DE photomasks was inspected by a mask inspection apparatus and found to satisfy the conditions required for a DE photomask of the DRAM hp22 nm generation. Further, using this DE photomask set, pattern transfer was performed on a resist film on a transfer target (wafer or the like) by the use of an exposure apparatus. Then, it was verified that there was no wiring short or disconnection in a finally formed fine high-density pattern of the transfer target otherwise caused by lack of pattern overlay accuracy and thus the DE photomask set had high overlay accuracy.

Further, with respect to a set of mask blanks manufactured in the same manner as described above, patterns for forming a circuit pattern of a laminated structure of a semiconductor device corresponding to the DRAM hp45 nm generation were formed in light-shielding films of the mask blanks through predetermined processes, respectively, thereby obtaining a set of photomasks. Using this photomask set, the patterns were transferred onto resist films, in turn, on a wafer by the use of an exposure apparatus. Then, it was verified that there was no wiring short or disconnection in the finally formed circuit pattern of the wafer between its upper and lower layers otherwise caused by lack of pattern overlay accuracy and thus the photomask set had high overlay accuracy.

EXAMPLE 4

With respect to a mask blank substrate set produced in the same manner as in Example 1, a phase shift film and a light-shielding film composed of a back-surface antireflection layer, a light-shielding layer, and a front-surface antireflection layer were formed on each of glass substrates. Specifically, using a mixed target of Mo and Si (at % ratio Mo:Si=10:90) as a sputtering target and using a mixed gas of Ar, $N_2$, and He (gas flow rate ratio Ar:$N_2$:He=5:49:46) as a sputtering gas, a MoSiN film was formed to a thickness of 69 nm as the phase shift film by setting the gas pressure to 0.3 Pa and the power of the DC power supply to 2.8 kW. Then, the substrates each formed with the phase shift film were heat-treated (annealed) at 250° C. for 5 minutes.

Then, the light-shielding film comprising the back-surface antireflection layer, the light-shielding layer, and the front-surface antireflection layer was formed on the phase shift film. Specifically, first, using a Cr target as a sputtering target and using a mixed gas of Ar, $CO_2$, $N_2$, and He (gas flow rate ratio Ar:$CO_2$:$N_2$:He=22:39:6:33) as a sputtering gas, a CrOCN film was formed to a thickness of 30 nm as the back-surface antireflection layer by setting the gas pressure to 0.2 Pa and the power of the DC power supply to 1.7 kW. Then, using a Cr target as a sputtering target and using a mixed gas of Ar and $N_2$ (gas flow rate ratio Ar:$N_2$=83:17) as a sputtering gas, a CrN film was formed to a thickness of 4 nm as the light-shielding layer by setting the gas pressure to 0.1 Pa and the power of the DC power supply to 1.7 kW. Then, using a Cr target as a sputtering target and using a mixed gas of Ar, $CO_2$, $N_2$, and He (gas flow rate ratio Ar:$CO_2$:$N_2$:He=21:37:11:31) as a sputtering gas, a CrOCN film was formed to a thickness of 14 nm as the front-surface antireflection layer by setting the gas pressure to 0.2 Pa and the power of the DC power supply to 1.8 kW. The light-shielding film comprising the back-surface antireflection layer, the light-shielding layer, and the front-surface antireflection layer formed under these conditions had low stress over the entire light-shielding film and the phase shift film also had low stress, and thus it was possible to suppress the change in shape of the substrate to minimum.

Then, in the same manner as in Example 1, produced mask blanks were subjected to a defect inspection using an inspection apparatus (M1350) and 5 mask blanks were selected from the passed mask blanks as a mask blank set.

Then, 2 mask blanks were extracted from the mask blank set thus obtained and a set of DP photomasks corresponding to the DRAM hp32 nm generation were produced in the same manner as in Example 1. Each of the DP photomasks was inspected by a mask inspection apparatus and found to satisfy the conditions required for a DP photomask of the DRAM hp32 nm generation. Further, using this DP photomask set, pattern transfer was performed on resist films, in turn, on a transfer target (wafer or the like) by the use of an exposure apparatus. Then, it was verified that there was no wiring short or disconnection in a finally formed fine high-density pattern of the transfer target otherwise caused by lack of pattern overlay accuracy and thus the DP photomask set had high overlay accuracy.

Further, 2 mask blanks were extracted from a mask blank set manufactured in the same manner as described above and a set of DE photomasks corresponding to the DRAM hp32 nm generation were produced in the same manner as in Example 1. Each of the DE photomasks was inspected by a mask inspection apparatus and found to satisfy the conditions required for a DE photomask of the DRAM hp32 nm generation. Further, using this DE photomask set, pattern transfer was performed on a resist film on a transfer target (wafer or the like) by the use of an exposure apparatus. Then, it was verified that there was no wiring short or disconnection in a finally formed fine high-density pattern of the transfer target otherwise caused by lack of pattern overlay accuracy and thus the DE photomask set had high overlay accuracy.

Further, with respect to a set of mask blanks manufactured in the same manner as described above, patterns for forming a circuit pattern of a laminated structure of a semiconductor device corresponding to the DRAM hp45 nm generation were formed in light-shielding films of the mask blanks through predetermined processes, respectively, thereby obtaining a set of photomasks. Using this photomask set, the patterns were transferred onto resist films, in turn, on a wafer by the use of an exposure apparatus. Then, it was verified that there was no wiring short or disconnection in the finally formed circuit pattern of the wafer between its upper and lower layers otherwise caused by lack of pattern overlay accuracy and thus the photomask set had high overlay accuracy.

EXAMPLE 5

With respect to a mask blank substrate set produced in the same manner as in Example 2, a phase shift film and a light-shielding film composed of a back-surface antireflection layer, a light-shielding layer, and a front-surface antireflection layer, all of which had the same structures as those in Example 4, were formed on each of glass substrates. Then, in the same manner as in Example 1, produced mask blanks were subjected to a defect inspection using an inspection apparatus (M1350) and 5 mask blanks were selected from the passed mask blanks as a mask blank set.

Then, 2 mask blanks were extracted from the mask blank set thus obtained and a set of DP photomasks corresponding to the DRAM hp32 nm generation were produced in the same manner as in Example 2. Each of the DP photomasks was inspected by a mask inspection apparatus and found to satisfy the conditions required for a DP photomask of the DRAM hp32 nm generation. Further, using this DP photomask set, pattern transfer was performed on resist films, in turn, on a transfer target (wafer or the like) by the use of an exposure apparatus. Then, it was verified that there was no wiring short or disconnection in a finally formed fine high-density pattern of the transfer target otherwise caused by lack of pattern overlay accuracy and thus the DP photomask set had high overlay accuracy.

Further, 2 mask blanks were extracted from a mask blank set manufactured in the same manner as described above and a set of DE photomasks corresponding to the DRAM hp32 nm generation were produced in the same manner as in Example 2. Each of the DE photomasks was inspected by a mask inspection apparatus and found to satisfy the conditions required for a DE photomask of the DRAM hp32 nm generation. Further, using this DE photomask set, pattern transfer was performed on a resist film on a transfer target (wafer or the like) by the use of an exposure apparatus. Then, it was verified that there was no wiring short or disconnection in a finally formed fine high-density pattern of the transfer target otherwise caused by lack of pattern overlay accuracy and thus the DE photomask set had high overlay accuracy.

Further, with respect to a set of mask blanks manufactured in the same manner as described above, patterns for forming a circuit pattern of a laminated structure of a semiconductor device corresponding to the DRAM hp45 nm generation were formed in light-shielding films of the mask blanks through predetermined processes, respectively, thereby obtaining a set of photomasks. Using this photomask set, the patterns were transferred onto resist films, in turn, on a wafer by the use of an exposure apparatus. Then, it was verified that there was no wiring short or disconnection in the finally formed circuit pattern of the wafer between its upper and lower layers otherwise caused by lack of pattern overlay accuracy and thus the photomask set had high overlay accuracy.

EXAMPLE 6

With respect to a mask blank substrate set produced in the same manner as in Example 3, a phase shift film and a light-shielding film composed of a back-surface antireflection layer, a light-shielding layer, and a front-surface antireflection layer, all of which had the same structures as those in Example 4, were formed on each of glass substrates. Then, in the same manner as in Example 1, produced mask blanks were subjected to a defect inspection using an inspection apparatus (M1350) and 5 mask blanks were selected from the passed mask blanks as a mask blank set.

Then, 2 mask blanks were extracted from the mask blank set thus obtained and a set of DP photomasks corresponding to the DRAM hp22 nm generation were produced in the same manner as in Example 3. Each of the DP photomasks was inspected by a mask inspection apparatus and found to satisfy the conditions required for a DP photomask of the DRAM hp22 nm generation. Further, using this DP photomask set, pattern transfer was performed on resist films, in turn, on a transfer target (wafer or the like) by the use of an exposure apparatus. Then, it was verified that there was no wiring short or disconnection in a finally formed fine high-density pattern of the transfer target otherwise caused by lack of pattern overlay accuracy and thus the DP photomask set had high overlay accuracy.

Further, 2 mask blanks were extracted from a mask blank set manufactured in the same manner as described above and a set of DE photomasks corresponding to the DRAM hp22 nm generation were produced in the same manner as in Example 3. Each of the DE photomasks was inspected by a mask inspection apparatus and found to satisfy the conditions required for a DE photomask of the DRAM hp22 nm generation. Further, using this DE photomask set, pattern transfer was performed on a resist film on a transfer target (wafer or the like) by the use of an exposure apparatus. Then, it was verified that there was no wiring short or disconnection in a finally formed fine high-density pattern of the transfer target otherwise caused by lack of pattern overlay accuracy and thus the DE photomask set had high overlay accuracy.

Further, with respect to a set of mask blanks manufactured in the same manner as described above, patterns for forming a circuit pattern of a laminated structure of a semiconductor device corresponding to the DRAM hp45 nm generation were formed in light-shielding films of the mask blanks through predetermined processes, respectively, thereby obtaining a set of photomasks. Using this photomask set, the patterns were transferred onto resist films, in turn, on a wafer by the use of an exposure apparatus. Then, it was verified that there was no wiring short or disconnection in the finally formed circuit pattern of the wafer between its upper and lower layers otherwise caused by lack of pattern overlay accuracy and thus the photomask set had high overlay accuracy.

EXAMPLE 7

With respect to a mask blank substrate set produced in the same manner as in Example 1, a MoSiON film (back-surface antireflection layer), a MoSi film (light-shielding layer), and a MoSiON film (front-surface antireflection layer) were formed as a light-shielding film on each of glass substrates. Specifically, using a mixed target of Mo:Si=21:79 (at % ratio) as a sputtering target and using a mixed gas of Ar, $O_2$, $N_2$, and He (gas flow rate ratio Ar:$O_2$:$N_2$:He=5:4:49:42) as a sputtering gas, a film made of molybdenum, silicon, oxygen, and nitrogen (MoSiON film: at % ratio of Mo and Si in the film was about 21:79) was formed to a thickness of 7 nm by setting the sputtering gas pressure to 0.2 Pa and the power of the DC power supply to 3.0 kW. Then, using the same target and using Ar as a sputtering gas, a film made of molybdenum and silicon (MoSi film: at % ratio of Mo and Si in the film was about 21:79) was formed to a thickness of 35 nm by setting the sputtering gas pressure to 0.1 Pa and the power of the DC power supply to 2.0 kW. Then, using a mixed target of Mo:Si=4:96 (at % ratio) as a sputtering target and using a mixed gas of Ar, $O_2$, $N_2$, and He (gas flow rate ratio Ar:$O_2$:$N_2$:He=5:4:49:42) as a sputtering gas, a film made of molybdenum, silicon, oxygen, and nitrogen (MoSiON film: at % ratio of Mo and Si in the film was about 4:96) was formed to a thickness of 10 nm by setting the sputtering gas pressure to 0.2 Pa and the power of the DC power supply to 3.0 kW. The total thickness of the light-shielding film was set to 52 nm. The light-shielding film comprising the back-surface antireflection layer, the light-shielding layer, and the front-surface antireflection layer formed under these conditions had low stress over the entire light-shielding film and thus it was possible to suppress the change in shape of the substrate to minimum.

Then, in the same manner as in Example 1, produced mask blanks were subjected to a defect inspection using an inspection apparatus (M1350) and 5 mask blanks were selected from the passed mask blanks as a mask blank set.

Then, 2 mask blanks were extracted from the mask blank set thus obtained and a set of DP photomasks corresponding to the DRAM hp32 nm generation were produced in the same manner as in Example 1. Each of the DP photomasks was inspected by a mask inspection apparatus and found to satisfy the conditions required for a DP photomask of the DRAM hp32 nm generation. Further, using this DP photomask set, pattern transfer was performed on resist films, in turn, on a transfer target (wafer or the like) by the use of an exposure apparatus. Then, it was verified that there was no wiring short or disconnection in a finally formed fine high-density pattern of the transfer target otherwise caused by lack of pattern overlay accuracy and thus the DP photomask set had high overlay accuracy.

Further, 2 mask blanks were extracted from a mask blank set manufactured in the same manner as described above and a set of DE photomasks corresponding to the DRAM hp32 nm generation were produced in the same manner as in Example 1. Each of the DE photomasks was inspected by a mask inspection apparatus and found to satisfy the conditions required for a DE photomask of the DRAM hp32 nm generation. Further, using this DE photomask set, pattern transfer was performed on a resist film on a transfer target (wafer or the like) by the use of an exposure apparatus. Then, it was verified that there was no wiring short or disconnection in a finally formed fine high-density pattern of the transfer target otherwise caused by lack of pattern overlay accuracy and thus the DE photomask set had high overlay accuracy.

Further, with respect to a set of mask blanks manufactured in the same manner as described above, patterns for forming a circuit pattern of a laminated structure of a semiconductor device corresponding to the DRAM hp45 nm generation were formed in light-shielding films of the mask blanks through predetermined processes, respectively, thereby obtaining a set of photomasks. Using this photomask set, the patterns were transferred onto resist films, in turn, on a wafer by the use of an exposure apparatus. Then, it was verified that there was no wiring short or disconnection in the finally formed circuit pattern of the wafer between its upper and lower layers otherwise caused by lack of pattern overlay accuracy and thus the photomask set had high overlay accuracy.

EXAMPLE 8

With respect to a mask blank substrate set produced in the same manner as in Example 2, a light-shielding film composed of a back-surface antireflection layer, a light-shielding layer, and a front-surface antireflection layer, all of which had the same structures as those in Example 7, was formed on each of glass substrates. Then, in the same manner as in Example 1, produced mask blanks were subjected to a defect inspection using an inspection apparatus (M1350) and 5 mask blanks were selected from the passed mask blanks as a mask blank set.

Then, 2 mask blanks were extracted from the mask blank set thus obtained and a set of DP photomasks corresponding to the DRAM hp32 nm generation were produced in the same manner as in Example 2. Each of the DP photomasks was inspected by a mask inspection apparatus and found to satisfy the conditions required for a DP photomask of the DRAM hp32 nm generation. Further, using this DP photomask set, pattern transfer was performed on resist films, in turn, on a transfer target (wafer or the like) by the use of an exposure apparatus. Then, it was verified that there was no wiring short or disconnection in a finally formed fine high-density pattern of the transfer target otherwise caused by lack of pattern overlay accuracy and thus the DP photomask set had high overlay accuracy.

Further, 2 mask blanks were extracted from a mask blank set manufactured in the same manner as described above and a set of DE photomasks corresponding to the DRAM hp32 nm generation were produced in the same manner as in Example 2. Each of the DE photomasks was inspected by a mask inspection apparatus and found to satisfy the conditions required for a DE photomask of the DRAM hp32 nm generation. Further, using this DE photomask set, pattern transfer was performed on a resist film on a transfer target (wafer or the like) by the use of an exposure apparatus. Then, it was verified that there was no wiring short or disconnection in a finally formed fine high-density pattern of the transfer target otherwise caused by lack of pattern overlay accuracy and thus the DE photomask set had high overlay accuracy.

Further, with respect to a set of mask blanks manufactured in the same manner as described above, patterns for forming a circuit pattern of a laminated structure of a semiconductor device corresponding to the DRAM hp45 nm generation were formed in light-shielding films of the mask blanks through predetermined processes, respectively, thereby obtaining a set of photomasks. Using this photomask set, the patterns were transferred onto resist films, in turn, on a wafer by the use of an exposure apparatus. Then, it was verified that there was no wiring short or disconnection in the finally formed circuit pattern of the wafer between its upper and lower layers otherwise caused by lack of pattern overlay accuracy and thus the photomask set had high overlay accuracy.

EXAMPLE 9

With respect to a mask blank substrate set produced in the same manner as in Example 3, a light-shielding film composed of a back-surface antireflection layer, a light-shielding layer, and a front-surface antireflection layer, all of which had the same structures as those in Example 7, was formed on each of glass substrates. Then, in the same manner as in Example 1, produced mask blanks were subjected to a defect inspection using an inspection apparatus (M1350) and 5 mask blanks were selected from the passed mask blanks as a mask blank set.

Then, 2 mask blanks were extracted from the mask blank set thus obtained and a set of DP photomasks corresponding to the DRAM hp22 nm generation were produced in the same manner as in Example 3. Each of the DP photomasks was inspected by a mask inspection apparatus and found to satisfy the conditions required for a DP photomask of the DRAM hp22 nm generation. Further, using this DP photomask set, pattern transfer was performed on resist films, in turn, on a transfer target (wafer or the like) by the use of an exposure apparatus. Then, it was verified that there was no wiring short or disconnection in a finally formed fine high-density pattern of the transfer target otherwise caused by lack of pattern overlay accuracy and thus the DP photomask set had high overlay accuracy.

Further, 2 mask blanks were extracted from a mask blank set manufactured in the same manner as described above and a set of DE photomasks corresponding to the DRAM hp22 nm generation were produced in the same manner as in Example 3. Each of the DE photomasks was inspected by a mask inspection apparatus and found to satisfy the conditions required for a DE photomask of the DRAM hp22 nm generation. Further, using this DE photomask set, pattern transfer was performed on a resist film on a transfer target (wafer or the like) by the use of an exposure apparatus. Then, it was verified that there was no wiring short or disconnection in a finally formed fine high-density pattern of the transfer target otherwise caused by lack of pattern overlay accuracy and thus the DE photomask set had high overlay accuracy.

Further, with respect to a set of mask blanks manufactured in the same manner as described above, patterns for forming a circuit pattern of a laminated structure of a semiconductor device corresponding to the DRAM hp45 nm generation were formed in light-shielding films of the mask blanks through predetermined processes, respectively, thereby obtaining a set of photomasks. Using this photomask set, the patterns were transferred onto resist films, in turn, on a wafer by the use of an exposure apparatus. Then, it was verified that there was no wiring short or disconnection in the finally formed circuit pattern of the wafer between its upper and lower layers otherwise caused by lack of pattern overlay accuracy and thus the photomask set had high overlay accuracy.

EXAMPLE 10

Local processing by an MRF (Magneto-Rheological Finishing) processing method was applied to the main surfaces of the glass substrates having been subjected to the ultra-precision polishing process and the ultrasonic cleaning in Example 2. First, the flatness of the main surface of the glass substrate was measured by a wavelength-shift interferometer using a wavelength modulation laser (measurement area: 142 mm square area having its center at the center of the substrate). Then, based on measured values, it was verified whether the flatness of the substrate main surface in the 142 mm square area was 0.3 µm or less. If the flatness exceeded 0.3 µm, a portion having a height exceeding 0.3 µm as seen from the lowest portion was specified as a portion where local processing was necessary, and the required processing amount was calculated. Then, based on the measured values of the substrate main surface, the reference curved surface of the reference substrate was fitted to the 132 mm square area of the substrate main surface. In this case, the fitting was performed so that the reference curved surface was not located at a height above the predetermined maximum allowable fitting difference (40 nm) with respect to the substrate main surface in the 132 mm square area. Then, a portion of the substrate main surface located above the predetermined maximum allowable fitting difference (40 nm) with respect to the reference curved surface fitted was specified as a portion where local processing was necessary, and the required processing amount was calculated. At this stage, the substrate for which it was judged that no local processing was necessary was a passed product usable as a mask blank substrate of this invention.

Then, local processing by the MRF processing method was applied to the glass substrate for which the local processing was judged necessary and a portion for the local processing was specified. The MRF processing method is a method of locally polishing a substrate by bringing polishing abrasive grains contained in a magnetic fluid into contact with the substrate by magnetic field assist and controlling the stay time of the polishing abrasive grains at a contact portion. In this polishing, as the convex degree of a convex portion increases, the stay time of the polishing abrasive grains at a contact portion is set to be longer. Conversely, as the convex degree of a convex portion decreases, the stay time of the polishing abrasive grains at a contact portion is set to be shorter.

Figure 13A:
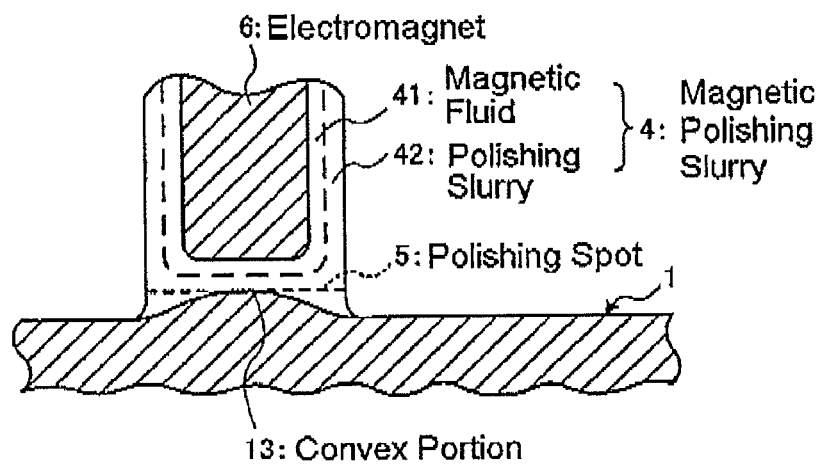
FIG. 13A is a schematic front sectional view for explaining a processing state by an MRF processing method in Example 10.
Figure 13B:
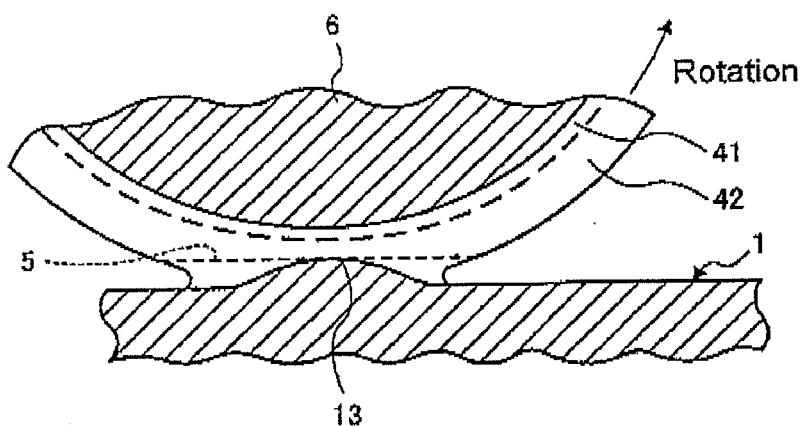
FIG. 13B is a schematic side sectional view for explaining the processing state by the MRF processing method in Example 10.

FIGS. 13A and 13B are schematic diagrams for explaining a processing state by the MRF processing method, wherein FIG. 13A is a front sectional view and FIG. 13B is a side sectional view. According to the MRF processing method, a mask blank substrate 1 being a workpiece is locally polished by bringing polishing abrasive grains (not illustrated) contained in a magnetic fluid 41 containing iron (not illustrated) into contact with the mask blank substrate 1 at high speed by magnetic field assistance and controlling the stay time of the polishing abrasive grains at a contact portion. That is, a mixed liquid (magnetic polishing slurry 4) of the magnetic fluid 41 and a polishing slurry 42 is loaded on a rotatably supported disk-shaped electromagnet 6 so that a radial end of the magnetic polishing slurry 4 is used as a polishing spot 5 for local processing, and a convex portion 13 to be removed is brought into contact with the polishing spot 5. With this configuration, the magnetic polishing slurry 4 flows along a disk-shaped magnetic field in a substantially two-layer state where the polishing slurry 42 is distributed much on the substrate 1 side and the magnetic fluid 1 is distributed much on the electromagnet 6 side. By using part of this state as the polishing spot 5 for carrying out local polishing and bringing it into contact with a surface of the substrate 1, the convex portion 13 is locally polished and controlled to a flatness of several tens of nanometers.

In this MRF processing method, as different from a conventional polishing method, the polishing spot 5 is constantly flowing and thus there is no degradation of processing accuracy due to abrasion of a processing tool or a change in shape thereof and, further, it is not necessary to press the substrate 1 under high load and therefore there is an advantage in that cracks or hidden cracks in a surface displacement layer are small in number. Further, in the MRF method, the removal amount can be easily adjusted by controlling the moving speed of the substrate 1 according to a machining allowance (required processing amount) set per predetermined area, when moving the substrate 1 while keeping the polishing spot 5 in contact with the substrate 1.

As the polishing slurry 42 mixed into the magnetic fluid 41, use is made of a slurry in which fine polishing grains are dispersed in a liquid. The polishing grains are, for example, silicon carbide, aluminum oxide, diamond, cerium oxide, zirconium oxide, manganese oxide, colloidal silica, or the like and are properly selected according to a material of a workpiece, the processing surface roughness thereof, and so on. The polishing grains are dispersed into a liquid such as water, an acid solution, or an alkaline solution to form the polishing slurry 42 which is then mixed into the magnetic fluid 41.

With respect to a portion where local polishing by the MRF processing method was judged necessary as a result of carrying out fitting between a main surface of the mask blank substrate 1 and the reference main surface, the local polishing was carried out by a calculated required processing amount. Then, since the main surface having been subjected to the local polishing was roughened, double-side polishing was performed only for a short time using a double-side polishing machine. The double-side polishing was performed under the following polishing conditions. The polishing conditions such as the processing pressure, the rotational speeds of upper and lower surface plates, and the polishing time were properly adjusted.

Polishing Liquid: colloidal silica (average grain size 70 nm)+alkaline aqueous solution (NaOH, pH11)

Polishing Pad: super-soft polisher (suede type)

As a result, the shape of each glass substrate was such that the main surface on the side where a thin film for forming a transfer pattern was to be formed had a convex shape being relatively high at its center and relatively low at its peripheral portion. The glass substrates having a difference of 40 nm or less upon fitting to the reference main surface, i.e. passed products usable as mask blank substrates of this invention, were 100 out of 100 and thus could be manufactured with an extremely high yield.

Using the obtained glass substrates, mask blank substrate sets, mask blank sets, and photomask sets were obtained in the same manners as in Examples 2, 5, and 8. Then, a verification was performed. As a result, the verification results were the same as those in the respective Examples. Thus, it was confirmed that the same results were obtained as those in the respective Examples with the high yield.

EXAMPLE 11

Like in Example 10, local processing by the MRF processing method was applied to the main surfaces of the glass substrates having been subjected to the ultra-precision polishing process and the ultrasonic cleaning in Example 3. Herein, the local processing was carried out so that the flatness of the substrate main surface in the 142 mm square area became 0.3 µm or less and, further, the flatness of the substrate main surface in the 132 mm square area became 0.2 µm or less. As a result, the shape of each glass substrate was such that the main surface on the side where a thin film for forming a transfer pattern was to be formed had a convex shape being relatively high at its center and relatively low at its peripheral portion. The glass substrates having a difference of 40 nm or less upon fitting to the reference main surface, i.e. passed products usable as mask blank substrates of this invention, were 100 out of 100 and thus could be manufactured with an extremely high yield.

Using the obtained glass substrates, mask blank substrate sets, mask blank sets, and photomask sets were obtained in the same manners as in Examples 3, 6, and 9. Then, verification was performed. As a result, the verification results were the same as those in the respective Examples. Thus, it was confirmed that the same results were obtained as those in the respective Examples with the high yield.

As described above, a substrate set of this invention is a mask blank substrate set comprising a plurality of substrates each for use in a mask blank for producing a photomask to be chucked on a mask stage of an exposure apparatus, wherein, in each of the substrates in the mask blank substrate set, a main surface, on the side where a thin film for forming a transfer pattern is to be formed, has a convex shape being relatively high at its center and relatively low at its peripheral portion, the flatness in a 142 mm square area, including a central portion, of the main surface is 0.3 µm or less, and the difference upon fitting to a reference main surface of a reference substrate is 40 nm or less. With this configuration, when a set of a plurality of photomasks for use in photolithography processes of respective layers in forming a circuit pattern of a laminated structure of a semiconductor device are produced using the substrate set of this invention or when a set of two or more photomasks for use in the DP or DE technique are produced using the substrate set of this invention, since the deformation of the substrates that occurs in the respective photomasks when chucked in an exposure apparatus in turn shows substantially the same tendency and the position offset of patterns on the substrates also shows substantially the same tendency, it is possible to significantly improve the overlay accuracy of transfer patterns of the photomasks.

This invention is not limited to the above-mentioned embodiment and can be carried out by appropriately changing it. For example, the materials, sizes, processing sequences, and so on in the above-mentioned embodiment are only examples and this invention can be carried out by changing them in various ways within a range capable of exhibiting the effect of this invention. Other than that, this invention can be carried out in various ways within a range not departing from the object of this invention.

What is claimed is:

1. A mask blank substrate set comprising:
 a plurality of substrates each for use in a mask blank for producing a photomask to be chucked on a mask stage of an exposure apparatus;
 wherein, in each of the substrates in the mask blank substrate set, a main surface, on a side where a thin film for forming a transfer pattern is to be formed, has a convex shape being relatively high at its center and relatively low at its peripheral portion, and a difference upon performing fitting in a 132 mm square area, including the central portion, of the main surface with respect to a reference main surface of a reference substrate is 40 nm or less.

2. The mask blank substrate set according to claim 1, wherein the reference substrate is a virtual substrate having a reference main surface with a shape obtained by averaging the shapes of the main surfaces, on the side where the thin film is to be formed, of the substrates in the mask blank substrate set.

3. The mask blank substrate set according to claim 1, wherein the reference substrate is a specific actual substrate.

4. The mask blank substrate set according to claim 1, wherein the reference substrate is a virtual substrate having a reference main surface with a spherical shape in a 132 mm square area including its central portion.

5. The mask blank substrate set according to claim 4, wherein the reference main surface of the virtual substrate has a flatness of 0.2 m or less in the 132 mm square area including its central portion.

6. The mask blank substrate set according to claim 1, wherein each of the substrates in the mask blank substrate set has a flatness of 0.3 µm or less in a 142 mm square area, including a central portion, of the main surface.

7. A mask blank set comprising:
 a plurality of mask blanks each for producing a photomask to be chucked on a mask stage of an exposure apparatus;
 wherein each of the mask blanks in the mask blank set has a structure in which a thin film for forming a transfer pattern is formed on a main surface of a substrate, and
 wherein, in the substrate of each of the mask blanks in the mask blank set, the main surface has a convex shape being relatively high at its center and relatively low at its peripheral portion, and a difference upon performing fitting in a 132 mm square area, including the central portion, of the main surface with respect to a reference main surface of a reference substrate is 40 nm or less.

8. The mask blank set according to claim 7, wherein the reference substrate is a virtual substrate having a reference main surface with a shape obtained by averaging the shapes of the main surfaces of the substrates of the mask blanks in the mask blank set.

9. The mask blank set according to claim 7, wherein the reference substrate is a specific actual substrate.

10. The mask blank set according to claim 7, wherein the reference substrate is a virtual substrate having a reference main surface with a spherical shape in a 132 mm square area including its central portion.

11. The mask blank set according to claim 10, wherein the reference main surface of the virtual substrate has a flatness of 0.2 µm or less in the 132 mm square area including its central portion.

12. The mask blank set according to claim 7, wherein the substrate of each of the mask blanks in the mask blank set has a flatness of 0.3 µm or less in a 142 mm square area, including a central portion, of the main surface.

13. A photomask set comprising:
a plurality of photomasks each of which is to be chucked on a mask stage of an exposure apparatus;
wherein each of the photomasks in the photomask set has a structure in which a thin film having a transfer pattern is formed on a main surface of a substrate, and
wherein, in the substrate of each of the photomasks in the photomask set, the main surface has a convex shape being relatively high at its center and relatively low at its peripheral portion, and a difference upon performing fitting in a 132 mm square area, including the central portion, of the main surface with respect to a reference main surface of a reference substrate is 40 nm or less.

14. The photomask set according to claim 13, wherein the reference substrate is a virtual substrate having a reference main surface with a shape obtained by averaging the shapes of the main surfaces of the substrates of the photomask in the photomask set.

15. The photomask set according to claim 13, wherein the reference substrate is a specific actual substrate.

16. The photomask set according to claim 13, wherein the reference substrate is a virtual substrate having a reference main surface with a spherical shape in a 132 mm square area including its central portion.

17. The photomask set according to claim 16, wherein the reference main surface of the virtual substrate has a flatness of 0.2 µm or less in the 132 mm square area including its central portion.

18. The photomask set according to claim 13, wherein the substrate of each of the photomask in the photomask set has a flatness of 0.3 µm or less in a 142 mm square area, including a central portion, of the main surface.

19. A semiconductor device manufacturing method comprising:
transferring, using a set of photomasks, transfer patterns of the photomasks in turn onto a semiconductor substrate by photolithography,
wherein each of the photomasks in the photomask set has a structure in which a thin film having one of the transfer patterns is formed on a main surface of a substrate, and
wherein, in the substrate of each of the photomasks in the photomask set, the main surface has a convex shape being relatively high at its center and relatively low at its peripheral portion, and a difference upon performing fitting in a 132 mm square area, including the central portion, of the main surface with respect to a reference main surface of a reference substrate is 40 nm or less.

20. The semiconductor device manufacturing method according to claim 19, wherein the reference substrate is a virtual substrate having a reference main surface with a shape obtained by averaging the shapes of the main surfaces of the substrates of the photomask in the photomask set.

21. The semiconductor device manufacturing method according to claim 19, wherein the reference substrate is a specific actual substrate.

22. The semiconductor device manufacturing method according to claim 19, wherein the reference substrate is a virtual substrate having a reference main surface with a spherical shape in a 132 mm square area including its central portion.

23. The semiconductor device manufacturing method according to claim 22, wherein the reference main surface of the virtual substrate has a flatness of 0.2 µm or less in the 132 mm square area including its central portion.

24. The semiconductor device manufacturing method according to claim 19, wherein the substrate of each of the photomask in the photomask set has a flatness of 0.3 µm or less in a 142 mm square area, including a central portion, of the main surface.

\* \* \* \* \*